US012593684B2

(12) United States Patent
Kang et al.

(10) Patent No.: US 12,593,684 B2
(45) Date of Patent: Mar. 31, 2026

(54) SEMICONDUCTOR PACKAGE INCLUDING HEAT DISSIPATION STRUCTURE

(71) Applicant: SAMSUNG ELECTRONICS CO., LTD., Suwon-si (KR)

(72) Inventors: Myungsam Kang, Hwaseong-si (KR); Jeongseok Kim, Cheonan-si (KR); Bongju Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 655 days.

(21) Appl. No.: 17/702,440

(22) Filed: Mar. 23, 2022

(65) Prior Publication Data

US 2023/0038413 A1 Feb. 9, 2023

(30) Foreign Application Priority Data

Aug. 4, 2021 (KR) ........................ 10-2021-0102297

(51) Int. Cl.
H01L 23/34 (2006.01)
H01L 23/00 (2006.01)
(Continued)

(52) U.S. Cl.
CPC .......... H01L 23/34 (2013.01); H01L 23/3114 (2013.01); H01L 23/49811 (2013.01);
(Continued)

(58) Field of Classification Search
CPC ......... H01L 23/49811; H01L 23/49822; H01L 23/49827; H01L 24/06; H01L 24/13;
(Continued)

(56) References Cited

U.S. PATENT DOCUMENTS

| | | |
|---|---|---|
| 8,759,147 B2 | 6/2014 | Choi et al. |
| 9,202,769 B2 | 12/2015 | Lin et al. |

(Continued)

FOREIGN PATENT DOCUMENTS

KR 20190052598 A 5/2019

OTHER PUBLICATIONS

"Written Decision on Registration", KR Application No. 10-2021-0102297, Jun. 2, 2025, 3 pp.

*Primary Examiner* — Trang Q Tran
(74) *Attorney, Agent, or Firm* — Wolf, Greenfield & Sacks, P.C.

(57) ABSTRACT

A semiconductor package includes a first rewiring layer; a lower semiconductor chip on the first rewiring layer; an upper semiconductor chip on the lower semiconductor chip; a heat dissipation structure on the upper semiconductor chip; a molding layer on the first rewiring layer so as to contact side surfaces of the lower semiconductor chip, the upper semiconductor chip, and the heat dissipation structure; a second rewiring layer on the heat dissipation structure; and one or more connection structures on the first rewiring layer and positioned adjacent to the side surfaces of the lower semiconductor chip and the upper semiconductor chip and configured to extend through the molding layer and connect the first rewiring layer to the second rewiring layer, wherein the upper semiconductor chip and the heat dissipation structure contact each other.

10 Claims, 20 Drawing Sheets

300

(51) Int. Cl.

| | |
|---|---|
| *H01L 23/31* | (2006.01) |
| *H01L 23/498* | (2006.01) |
| *H01L 25/16* | (2023.01) |

(52) U.S. Cl.
CPC .. *H01L 23/49822* (2013.01); *H01L 23/49827* (2013.01); *H01L 24/06* (2013.01); *H01L 24/13* (2013.01); *H01L 25/16* (2013.01); *H01L 2224/04026* (2013.01); *H01L 2224/13147* (2013.01)

(58) Field of Classification Search
CPC ........... H01L 25/16; H01L 2224/04026; H01L 2224/13147
See application file for complete search history.

(56) References Cited

U.S. PATENT DOCUMENTS

| | | | |
|---|---|---|---|
| 9,911,700 B2 | 3/2018 | Hurwitz et al. | |
| 10,510,595 B2 | 12/2019 | Wu et al. | |
| 10,529,698 B2 | 1/2020 | Yu et al. | |
| 10,546,844 B2 | 1/2020 | Kim et al. | |
| 10,636,721 B2 | 4/2020 | Kim et al. | |
| 10,643,919 B2 | 5/2020 | Oh et al. | |
| 11,710,688 B2 * | 7/2023 | Liu ....................... | H01L 25/105 257/773 |
| 2014/0077394 A1 * | 3/2014 | Chang ................. | H01L 23/4334 257/782 |
| 2019/0139853 A1 * | 5/2019 | Oh ...................... | H01L 23/3135 |
| 2019/0237382 A1 | 8/2019 | Kim et al. | |
| 2020/0006214 A1 * | 1/2020 | Tsai ....................... | H01L 25/50 |
| 2020/0051899 A1 | 2/2020 | Mallik et al. | |
| 2021/0005527 A1 | 1/2021 | Choi et al. | |

* cited by examiner

Chip 1

Chip 3

Chip 2

SEMICONDUCTOR PACKAGE INCLUDING HEAT DISSIPATION STRUCTURE

CROSS-REFERENCE TO RELATED APPLICATION

This application is based on and claims priority under 35 U.S.C. § 119 to Korean Patent Application No. 10-2021-0102297, filed on Aug. 4, 2021, in the Korean Intellectual Property Office, the disclosure of which is incorporated by reference herein in its entirety.

BACKGROUND

The inventive concept relates to a semiconductor package, and more particularly, to a semiconductor package including a heat dissipation structure.

As the demand for semiconductor chips with greater data storage capacity has increased, the demand for thin, lightweight semiconductor packages has also increased. In addition, the demand for semiconductor chips with enhanced functionality has also increased. This increased demand for data storage capacity, functionality, and reduced semiconductor package size may present issues with respect to heat dissipation.

SUMMARY

The inventive concept provides a semiconductor package having enhanced heat dissipation characteristics.

According to an aspect of the inventive concept, there is provided a semiconductor package including a first rewiring layer, a lower semiconductor chip on the first rewiring layer, a first chip connection terminal between the lower semiconductor chip and the first rewiring layer, the first chip connection terminal configured to connect the lower semiconductor chip to the first rewiring layer; an upper semiconductor chip on the lower semiconductor chip, a heat dissipation structure on the upper semiconductor chip, a molding layer arranged on the first rewiring layer, wherein the molding layer contacts respective side surfaces of the lower semiconductor chip, the upper semiconductor chip, and the heat dissipation structure, a second rewiring layer on the heat dissipation structure, and one or more connection structures on the first rewiring layer, wherein the one or more connection structures are adjacent to the side surfaces of the lower semiconductor chip and the upper semiconductor chip and extend through the molding layer to connect the first rewiring layer to the second rewiring layer, wherein a horizontal width of the lower semiconductor chip and a horizontal width of the upper semiconductor chip are different from each other, and the upper semiconductor chip and the heat dissipation structure contact each other.

According to another aspect of the inventive concept, there is provided a semiconductor package including a first rewiring layer, a lower semiconductor chip on the first rewiring layer, a first chip connection terminal between the lower semiconductor chip and the first rewiring layer, the first chip connection terminal configured to connect the lower semiconductor chip to the first rewiring layer; an upper semiconductor chip on the lower semiconductor chip, a second chip connection terminal between the lower semiconductor chip and the upper semiconductor chip, the second chip connection terminal configured to connect the lower semiconductor chip to the upper semiconductor chip, a heat dissipation structure on the upper semiconductor chip, a second rewiring layer on the heat dissipation structure; a first molding layer on the first rewiring layer, wherein the first molding layer contacts respective side surfaces of the upper semiconductor chip and the heat dissipation structure, a second molding layer on the first rewiring layer, wherein the second molding layer contacts a side surface of the first molding layer, and one or more connection structures adjacent to the side surfaces of the upper semiconductor chip and the lower semiconductor chip, wherein the one or more connection structures extend through the second molding layer and connect the first rewiring layer to the second rewiring layer, wherein a horizontal width of the upper semiconductor chip and a horizontal width of the lower semiconductor chip are different from each other, and the upper semiconductor chip and the heat dissipation structure contact each other, and an upper surface of the heat dissipation structure, upper surfaces of the one or more connection structures, and a lower surface of the second rewiring layer are co-planar.

According to another aspect of the inventive concept, there is provided a semiconductor package of a package on package (POP) including a lower semiconductor package and an upper semiconductor package, wherein at least one of the lower semiconductor package and the upper semiconductor package includes a first rewiring layer, a lower semiconductor chip on the first rewiring layer, a first chip connection terminal between the lower semiconductor chip and the first rewiring layer, the first chip connection terminal configured to connect the lower semiconductor chip to the first rewiring layer, an upper semiconductor chip on the lower semiconductor chip, a second chip connection terminal between the lower semiconductor chip and the upper semiconductor chip, the second ship connection terminal configured to connect the lower semiconductor chip and the upper semiconductor chip, a heat dissipation structure on the upper semiconductor chip, a second rewiring layer on the heat dissipation structure, a first molding layer on the first rewiring layer, wherein the first molding layer contacts respective side surfaces of the lower semiconductor chip, the upper semiconductor chip, and the heat dissipation structure, a second molding layer on the first rewiring layer, wherein the second molding layer contacts a side surface of the first molding layer, and one or more connection structures on the first rewiring layer, wherein the one or more connection structures are adjacent to the side surfaces of the upper semiconductor chip and the lower semiconductor chip, and wherein the one or more connection structures extend through the second molding layer and connect the first rewiring layer to the second rewiring layer, wherein a horizontal width of the upper semiconductor chip and a horizontal width of the lower semiconductor chip are different from each other, and the upper semiconductor chip and the heat dissipation structure contact each other, the upper semiconductor chip and the heat dissipation structure are connected to each other through a conductive via, and an upper surface of the heat dissipation structure, upper surfaces of the one or more connection structures, and a lower surface of the second rewiring layer are co-planar.

BRIEF DESCRIPTION OF THE DRAWINGS

Embodiments of the inventive concept will be more clearly understood from the following detailed description taken in conjunction with the accompanying drawings in which:

FIGS. 1A through 1F are plan views and cross-sectional views of a semiconductor package according to an example embodiment;

Figure 4B:
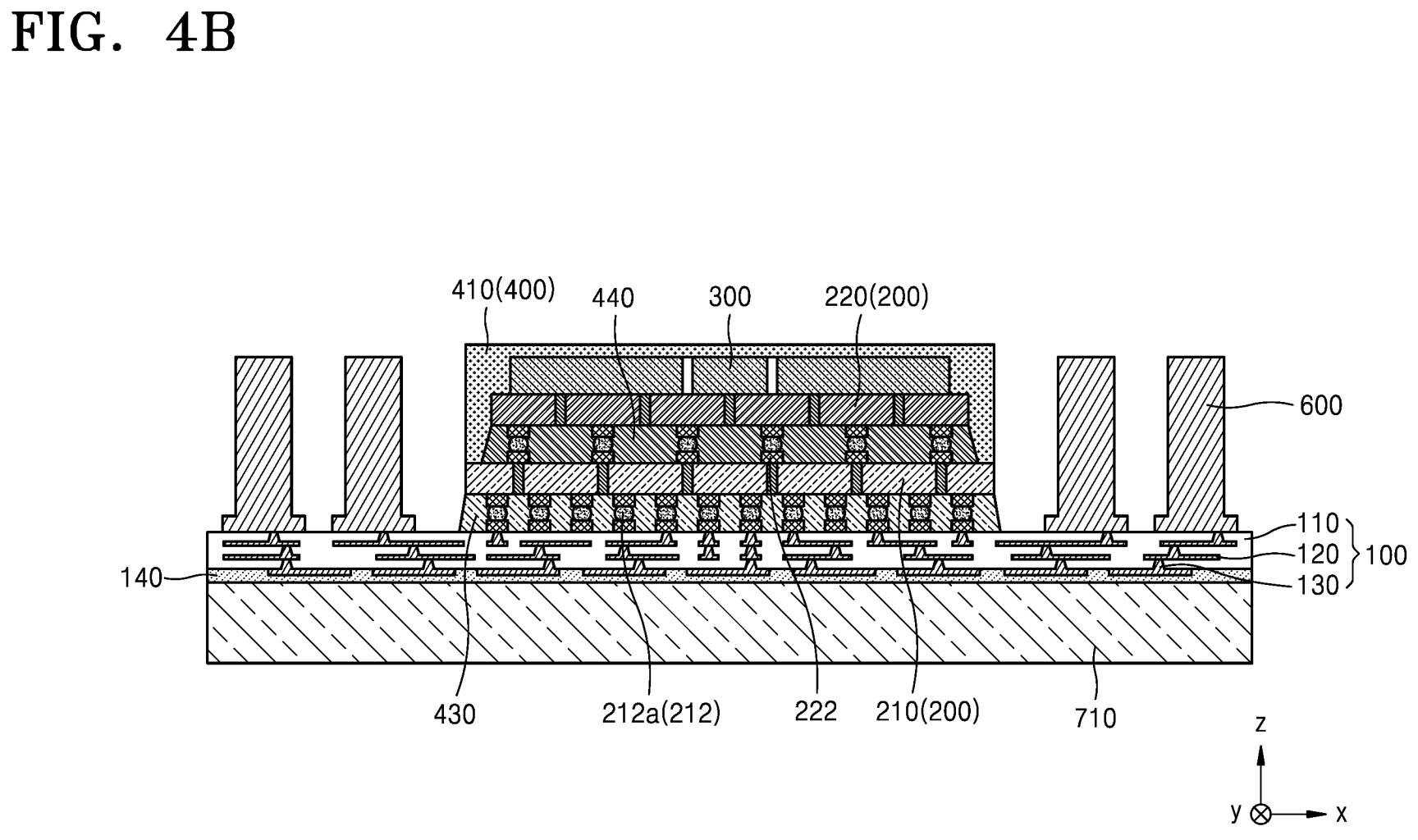
Figure 4C:
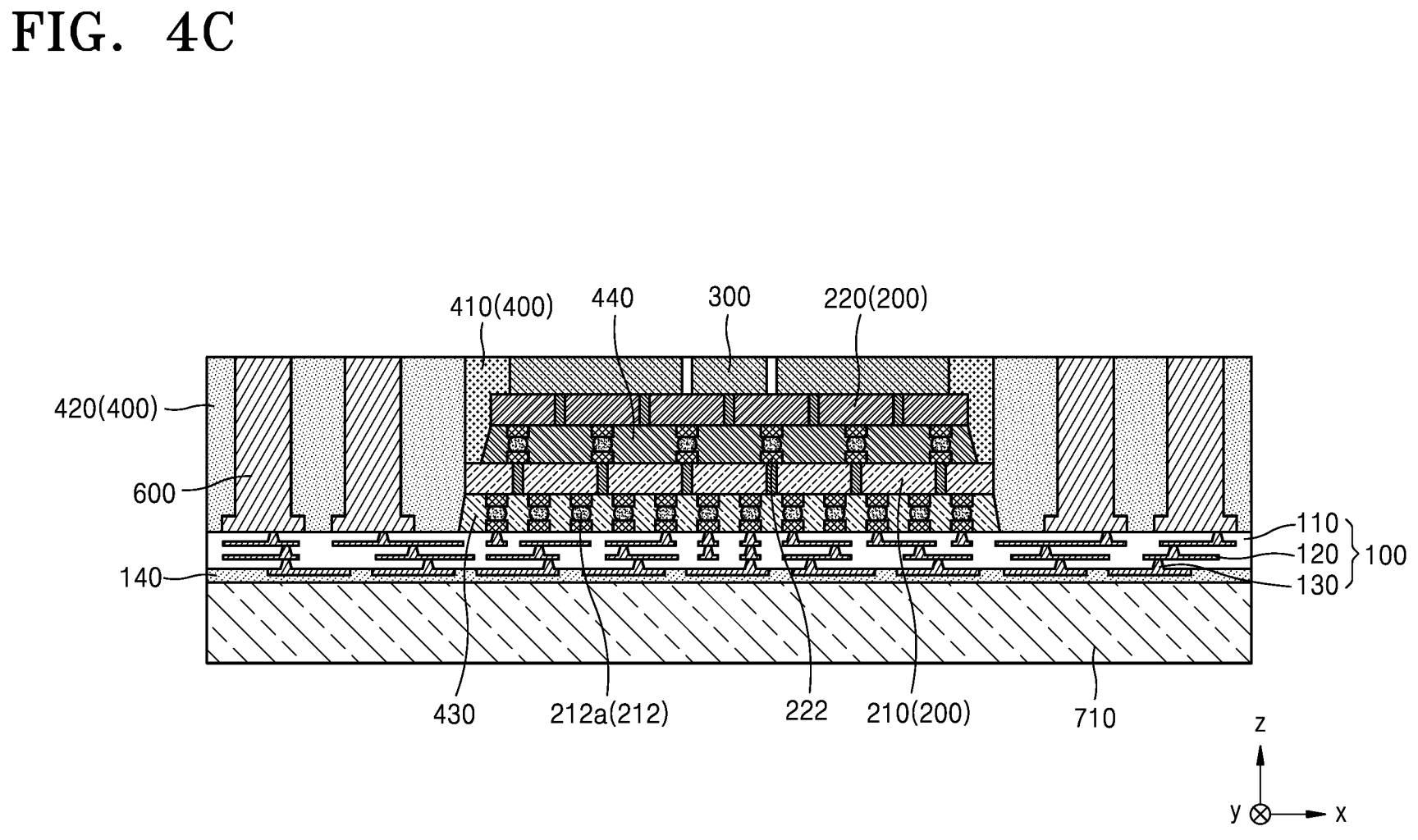
Figure 4E:
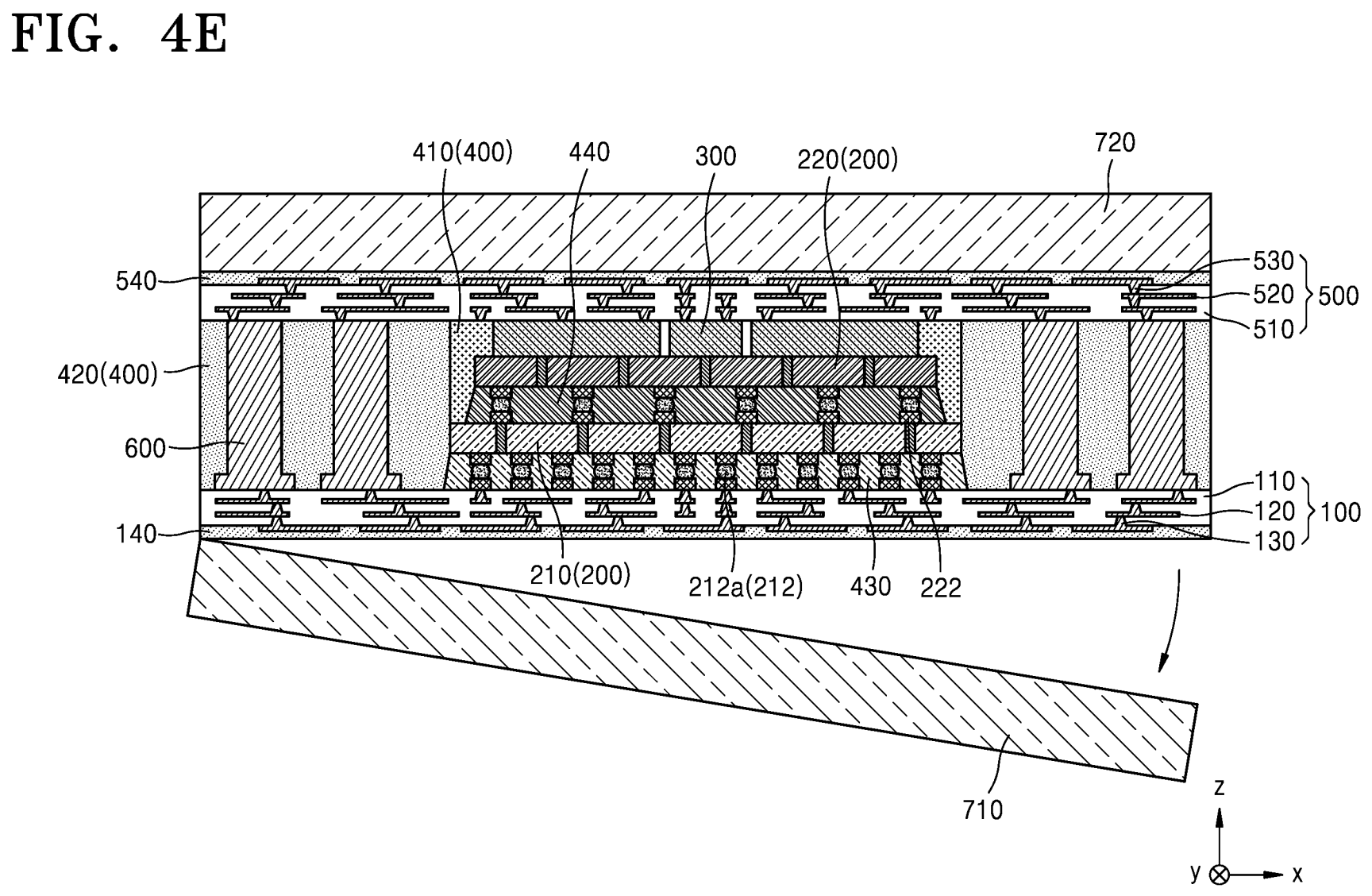
Figure 4F:
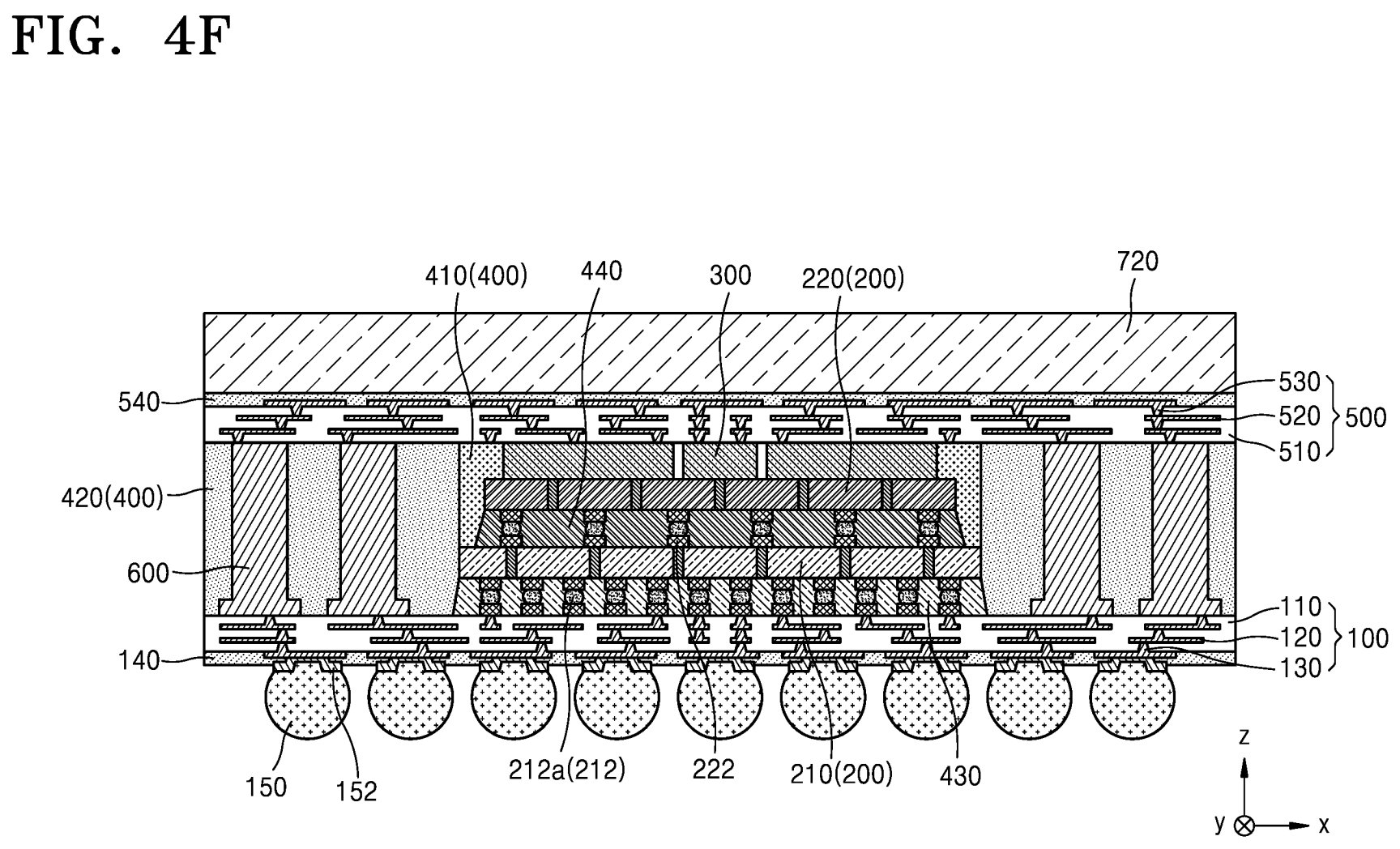

FIGS. 4A through 4F are views illustrating a method of manufacturing a semiconductor package with a chip-last package structure according to an example embodiment; and FIGS. 5A through 5F are views illustrating a method of manufacturing a semiconductor package with a chip-first package structure according to an example embodiment.

DETAILED DESCRIPTION OF THE EMBODIMENTS

Figure 1A:
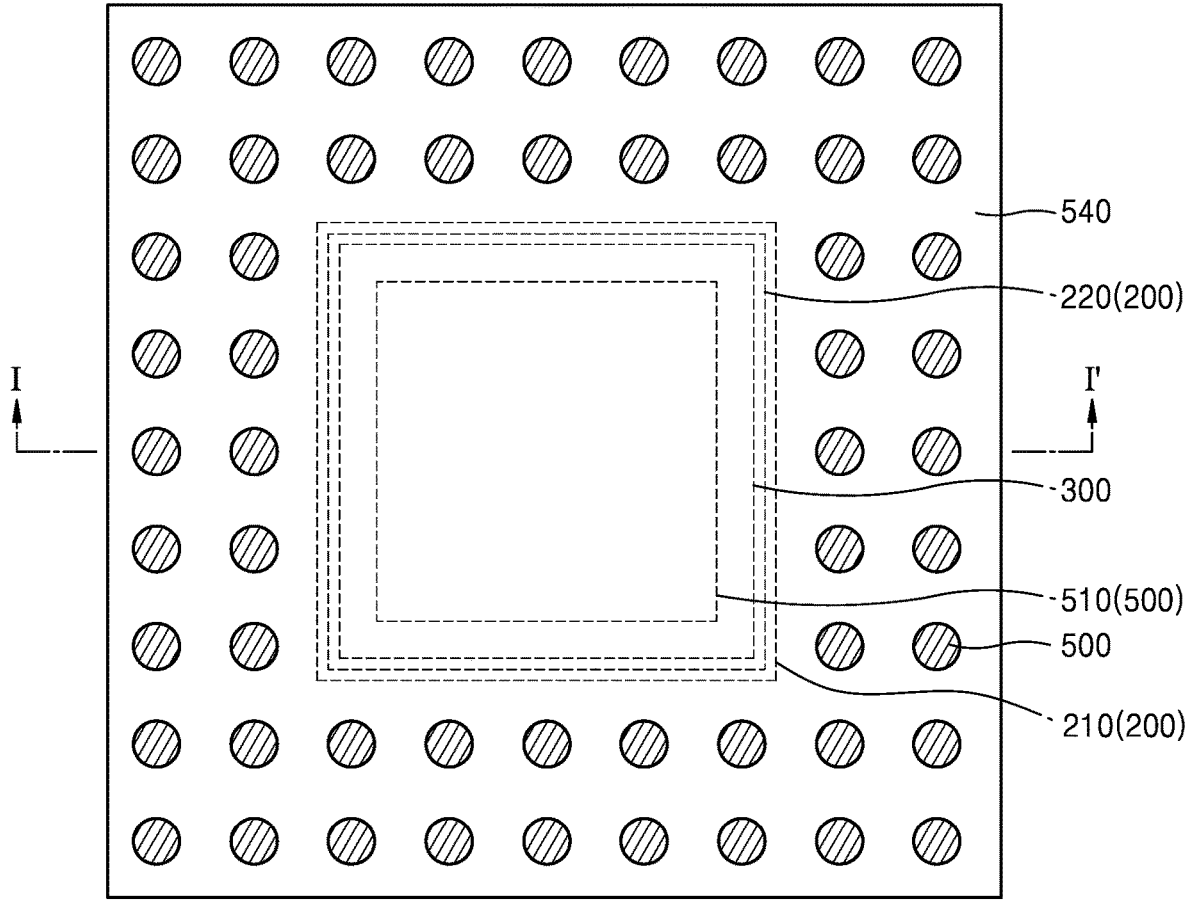
Figure 1A:
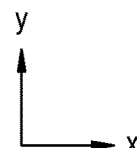

Hereinafter, example embodiments of the inventive concept will be described in detail with reference to the accompanying drawings. Like reference numerals are used for the same components in the drawings, and a redundant description thereof is omitted.

FIG. 1A is a plan view of a semiconductor package 10 according to an example embodiment, and FIGS. 1B through 1F are cross-sectional views of the semiconductor package 10 of FIG. 1A taken along line I-I.'

Referring to FIGS. 1A through 1F, the semiconductor package 10 according to the example embodiment may include a first rewiring layer 100, a lower semiconductor chip 210, an upper semiconductor chip 220, a heat dissipation structure 300, a molding structure or layer 400, a second rewiring layer 500, and a connection structure 600.

The semiconductor package 10 may be a lower semiconductor package 10 or an upper semiconductor package 10 that constitutes a package on package (POP) type of semiconductor package.

When, in a POP structure, a lower semiconductor package is the semiconductor package 10 according to the inventive concept, owing to the presence of the heat dissipation structure 300, heat generated in the lower semiconductor package 10 may be effectively dissipated. In the POP type of semiconductor package, an external connection terminal of the upper semiconductor package 10 may be in contact with an upper surface of the second rewiring layer 500 of the lower semiconductor package 10.

The semiconductor package 10 may have a three-dimensional (3D) structure, wherein semiconductor chips 200 that are the same or different from each other are stacked manyfold in a vertical direction so that a distance between the semiconductor chips 200 may be reduced. The semiconductor chips 200 may each have a through via so that time required for data transfer with another semiconductor chip 200 may be reduced. In the semiconductor package 10 having a 3D structure, various types of semiconductor chips 200 may be freely arranged so that data processing speed of the semiconductor chips 200 may be increased. The semiconductor package 10 is not limited to the semiconductor package 10 having a 3D structure but may have a different structure.

For example, the semiconductor package 10 may be a wafer level package (WLP), a fan-out wafer level package (FOWLP) or a fan-in wafer level package (FIWLP) in which an external connection terminal 150 or an external connection pad 152 is present even outside the semiconductor chip 200 or only inside the semiconductor chip 200. Also, the semiconductor package 10 may be a semiconductor package 10 having a 2.5-dimensional structure in which the semiconductor chips 200 are stacked flatwise. The semiconductor package 10 having the 2.5-dimensional structure may refer to a semiconductor package 10 in which a plurality of memory semiconductor chips 200 are stacked on the same plane and logic semiconductor chips 200 and the plurality of memory semiconductor chips 200 are horizontally stacked on the same plane. The plurality of memory semiconductor chips 200 and the logic semiconductor chip 200 may be connected to each other via an interposer substrate.

For example, the semiconductor package 10 may be a chip-last fan out semiconductor package in which the first rewiring layer 100 is first formed and then at least one semiconductor chip 200 is mounted on the first rewiring layer 100. In another example embodiment, the semiconductor package 10 may have a chip-first package structure in which at least one semiconductor chip 200 is mounted on a tape and the periphery of the semiconductor chip 200 is surrounded by the molding layer 400 and then the first rewiring layer 100 is formed. In some example embodiment, the semiconductor package 10 may be a fan-out panel level package (FOPLP).

The semiconductor package 10 may have a fan-out package structure in which the horizontal width and the horizontal area of the first rewiring layer 100 are greater than at least the horizontal width and the horizontal area of a footprint constituted by the semiconductor chips 200. In the fan-out package structure, the external connection terminal 150 may be widely arranged beyond lower surfaces of the semiconductor chips 200. As described above, when the first rewiring layer 100 is configured to rearrange a first chip connection terminal 212 of the lower semiconductor chip 210 as the external connection terminal 150 in a wider portion than the lower surfaces of the lower semiconductor chip 210, the semiconductor package 10 may have a fan-out package structure. In another example embodiment, the semiconductor package 10 may have a fan-in package structure in which the horizontal width and the horizontal area of the first rewiring layer 100 are smaller than or the same as at least the horizontal width and the horizontal area of the footprint constituted by the semiconductor chips 200.

The semiconductor package 10 according to the example embodiment may include the heat dissipation structure 300 on the semiconductor chip 200 so that heat generated in the semiconductor chip 200 may be effectively discharged through the heat dissipation structure 300. Thus, heat dissipation characteristics of the semiconductor package 10 may be optimized. For example, heat generated in a hot-spot (HS) of the semiconductor chip 200 may be smoothly transferred in a direction of a lower surface and in a direction of an upper surface of the semiconductor chip 200 and thus, heat may be effectively discharged to the outside. In particular, in the semiconductor package 10 according to the example embodiment, the heat dissipation structure 300 may be arranged on an upper surface of the upper semiconductor chip 220. Thus, heat generated in the semiconductor chip 200 may be rapidly dispersed in the heat dissipation structure 300 having very high thermal conductivity and may be uniformly transferred from the heat dissipation structure 300 to the second rewiring layer 500 on the heat dissipation structure 300. Thus, an area in which a heat dissipation function is performed may be extended from the heat dissipation structure 300 to the second rewiring layer 500 so that the heat dissipation function of the semiconductor package 10 may be further enhanced.

Furthermore, in a logic semiconductor chip 200 such as an application processor (AP), heat dissipation characteristics in which heat is rapidly discharged to enhance operation speed and performance, may become significant. Thus, the semiconductor package 10 according to the example embodiment may be applied to the semiconductor package 10 in which heat dissipation characteristics are significant, to optimize the heat dissipation characteristics and thus to greatly contribute to enhancement in operation speed and performance of the semiconductor package 10.

The first rewiring layer 100 may be disposed below the lower semiconductor chip 210 such that the first chip connection terminals 212 of the lower semiconductor chip 210 are outside the lower semiconductor chip 210. In more detail, the first rewiring layer 100 may include a lower insulating layer 110, a first rewiring line 120, and a conductive via 130. However, the thickness of the first rewiring layer 100 is not limited thereto but may be variously modified.

The lower insulating layer 110 may be formed of an insulating material, for example, a photo-imageable dielectric (PID) resin, and may further include an inorganic filler. The lower insulating layer 110 may have a multi-layer structure according to a multi-layer structure of the first rewiring line 120. However, in FIG. 1B, for convenience, the lower insulating layer 110 may have a single layer structure. When the lower insulating layer 110 has a multi-layer structure, the lower insulating layer 110 may be formed of the same material or different materials.

The first rewiring line 120 may be formed of multi-layers, and the first rewiring lines 120 may be connected to each other by the conductive via 130.

The conductive via 130 may be configured to transmit an electrical signal and/or heat from an inside of the semiconductor package 10. The conductive via 130 may include metal such as molybdenum (Mo), manganese (Mn), cobalt (Co), tin (Sn), nickel (Ni), magnesium (Mg), rhenium (Re), beryllium (Be), gallium (Ga), ruthenium (Ru), or an alloy thereof. However, the example embodiment may not be limited thereto. A photosensitive insulating material may be used in an exposure process and a development process so that the conductive via 130 and a conductive via to be described later may be manufactured.

A first passivation layer 140 may be disposed on a lower surface of the first rewiring layer 100. The first passivation layer 140 may be configured to cover and protect the first rewiring layer 100. The first passivation layer 140 may include an insulating material, for example, resin. However, the material of the first passivation layer 140 is not limited to resin.

The external connection pad 152 may be formed on the lower surface of the first passivation layer 140, and the external connection terminal 150 may be disposed on the external connection pad 152. The external connection pad 150 may be electrically connected to a chip pad through the first rewiring line 120 of the first rewiring layer 100. The external connection terminal 150 may be configured to connect the semiconductor package 10 to a main board of an electronic apparatus on which the semiconductor package 10 is mounted. The external connection pad 152 may include a solder ball of a metal material including at least one of a conductive material, for example, Sn, silver (Ag), copper (Cu), and aluminum (Al).

Figure 1B:
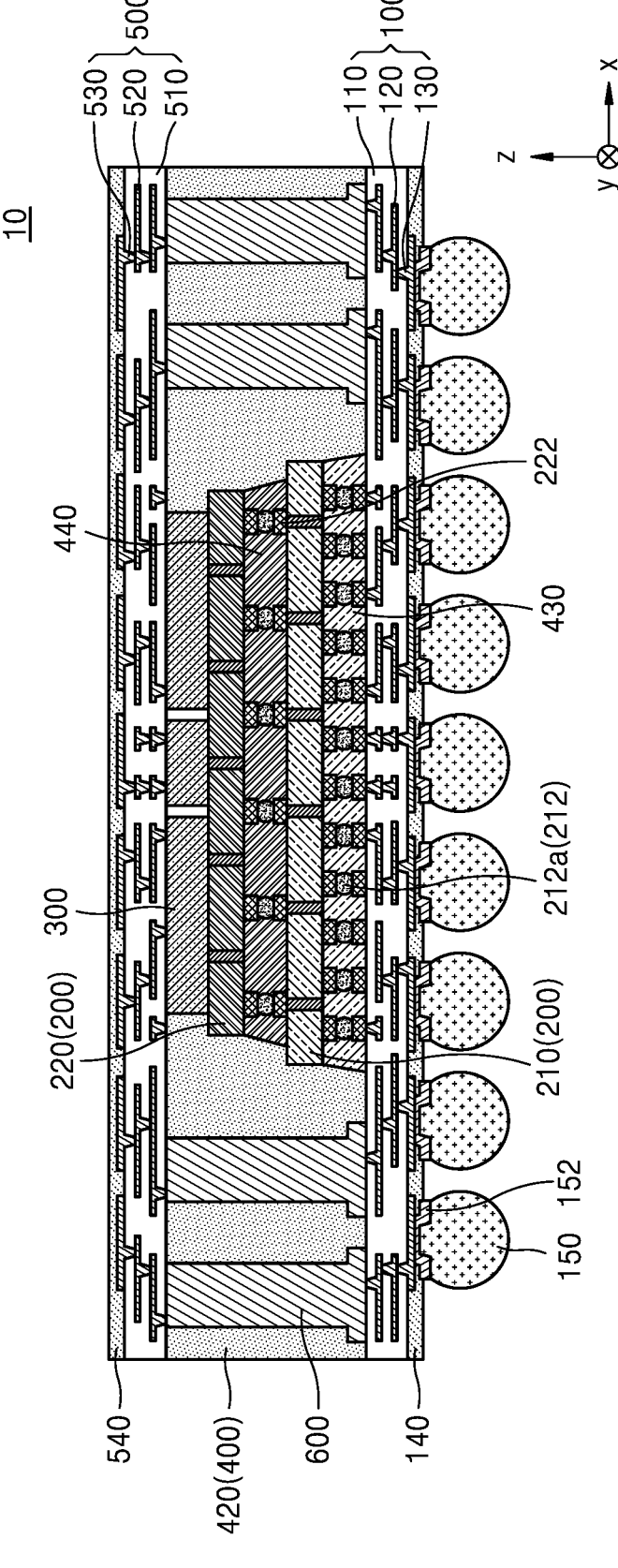

As shown in FIG. 1B, the external connection pad 152 and the external connection terminal 150 may be arranged on a portion corresponding to the lower surface of the semiconductor chip 200 and a portion that extends from the lower surface of the semiconductor chip 200 to the outside in a first direction (x-direction) and in a second direction (y-direction). As a result, the first rewiring layer 100 may be configured to rearrange a first chip connection terminal 212 of the lower semiconductor chip 210 as the external connection terminal 152 in a wider portion than the lower surface of the lower semiconductor chip 210.

According to an example embodiment, the first rewiring layer 100 may be substituted with a semiconductor substrate. The semiconductor substrate may include silicon (Si). However, the example embodiment is not limited thereto, and the semiconductor substrate may include a semiconductor element such as germanium (Ge), or a compound semiconductor such as silicon carbide (SiC), gallium arsenide (GaAs), indium arsenide (InAs), and indium phosphide (InP).

The semiconductor substrate may be a printed circuit board (PCB) including a plurality of package substrate pads. However, the semiconductor substrate is not limited to the structure and material of the PCB but may include various types of substrates.

An active layer may be formed on a lower portion of the semiconductor substrate. Various types of a plurality of individual devices may be formed on the active layer. In an example embodiment, the plurality of individual devices may include various microelectronic devices, for example, complementary metal-insulator-semiconductor (CMOS) transistors, metal-oxide-semiconductor field effect transistors (MOSFETs), system large scale integration (LSI), an image sensor such as a CMOS imaging sensor (CIS), a micro-electro-mechanical system (MEMS), an active device, and a passive device.

The semiconductor package 10 may include a plurality of semiconductor chips 200. The plurality of semiconductor chips 200 may be classified into a lower semiconductor chip 210 and an upper semiconductor chip 220 according to the position relationship therebetween. The semiconductor chips 200 may include a logic semiconductor chip 200 and/or a memory semiconductor chip 200. For example, the logic semiconductor chip 200 may be an AP, a microprocessor, a central processing unit (CPU), a controller, a graphic processor unit (GPU), or an application specific integrated circuit (ASIC). Also, the memory semiconductor chip 200 may be volatile memory such as dynamic random access memory (DRAM) or static random access memory (SRAM), or nonvolatile memory such as phase-change random access memory (PRAM), magneto-resistive random access memory (MRAM), ferroelectric random access memory (FeRAM), or resistive random access memory (RRAM).

In FIG. 1B, the semiconductor package 10 includes two semiconductor chips 200. However, the example embodiment is not limited thereto, and the semiconductor package 10 may include three or more semiconductor chips. For example, the semiconductor package 10 may include a plurality of semiconductor chips 200. The semiconductor package 10 may be a system in package (SIP) in which different types of a plurality of semiconductor chips 200 are electrically connected to each other and operate as one system.

The semiconductor chip 200 may include a chip connection terminal arranged on a lower surface of the semiconductor chip 200, for example, a chip pad or conductive via. In the semiconductor package 10 according to the example embodiment, the lower surface on which the chip connection terminal of the semiconductor chip 200 is disposed, may be an active surface, and an upper surface opposite to the lower surface may be an inactive surface. The active surface may be one surface of the semiconductor chip 200 toward the first rewiring layer 100, and the inactive surface may be one surface of the semiconductor chip 200 toward the second rewiring layer 500. The chip pad or the conductive via may be electrically connected to another component in the semiconductor chip 200, for example, an integrated circuit (IC).

An upper semiconductor chip 220 may be disposed on an upper surface of the lower semiconductor chip 210. As described above, the active surface of the upper semiconductor chip 220 may be connected to the inactive surface of the lower semiconductor chip 210 through the chip pad or conductive via.

According to an example embodiment, the lower semiconductor chip 210 may be a logic semiconductor chip 200, and the upper semiconductor chip 220 may be a memory semiconductor chip 200. In another example embodiment, the lower semiconductor chip 210 may be a memory semiconductor chip 200, and the upper semiconductor chip 220 may be a logic semiconductor chip 200.

When a plurality of semiconductor chips 200 are used, the areas of the plurality of semiconductor chips 200 may be different from each other. That is, the horizontal widths of the semiconductor chips 200 may be different from each other. For example, the area of the lower semiconductor chip 210 may be greater than the area of the upper semiconductor chip 220.

The semiconductor chip 200 may have a through via. The through via may be a through silicon via (TSV) having a structure in which the TSV passes through silicon of the semiconductor chip 200. The TSV may refer to a through via through which a fine hole is drilled in the semiconductor chip 200 and is connected to an electrode inside the semiconductor chip 200 to transmit an electrical signal.

When the area of the lower semiconductor chip 210 is greater than the area of the upper semiconductor chip 220, more through vias may be easily disposed in the lower semiconductor chip 210 than in the upper semiconductor chip 220. As the number of through vias increases, heat generated in the semiconductor package 10 may be more easily dissipated to the outside of the semiconductor package 10.

Next, the area of the upper semiconductor chip 220 may be greater than the area of the lower semiconductor chip 210. In this case, a heat dissipation structure 300 may be mounted on the inactive surface of the upper semiconductor chip 220. The lower semiconductor chip 210 may be mounted on the upper semiconductor chip 220, and an under-fill may be filled between the semiconductor chips 200 so that stable bonding between the semiconductor chips 200 may be maintained. That is, the under-fill may protect a chip connection terminal.

The underfill may include an epoxy resin formed by a capillary under-fill method, for example. In an example embodiment, the under-fill may be a nonconductive film (NCF).

After the under-fill is filled, a side surface of the under-fill may be surrounded by the molding layer 400. A portion of the surface of the molding layer 400 may be removed by grinding. Thereafter, the semiconductor chips 200 may be connected to the first rewiring layer 100 and the external connection pad 152.

The under-fill may be configured to protect the chip connection terminal. Thus, an under-fill layer may be configured to protect the periphery of the first chip connection terminal 212 and/or the second chip connection terminal 222.

The first under-fill layer 430 may surround the first chip connection terminal 212, and the second under-fill layer 440 may surround the second chip connection terminal 222.

Also, when a plurality of semiconductor chips 200 are stacked, connection between the semiconductor chips 200 may be Cu-to-Cu direct bonded by using copper (Cu). When the semiconductor chips 200 are directly bonded to each other, no conductive bump may be present between the semiconductor chips 200. For example, the semiconductor chips 200 may be Cu-to-Cu direct bonded to each other by using conductive vias.

The chip connection terminal may be arranged between the semiconductor chip 200 and the semiconductor chip 200 or between the semiconductor chip 200 and the first rewiring layer 100 and may be configured to electrically connect a plurality of individual devices in the semiconductor chip 200, the semiconductor chips 200 and the semiconductor chip 200 and the first rewiring layer 100.

Figure 1C:
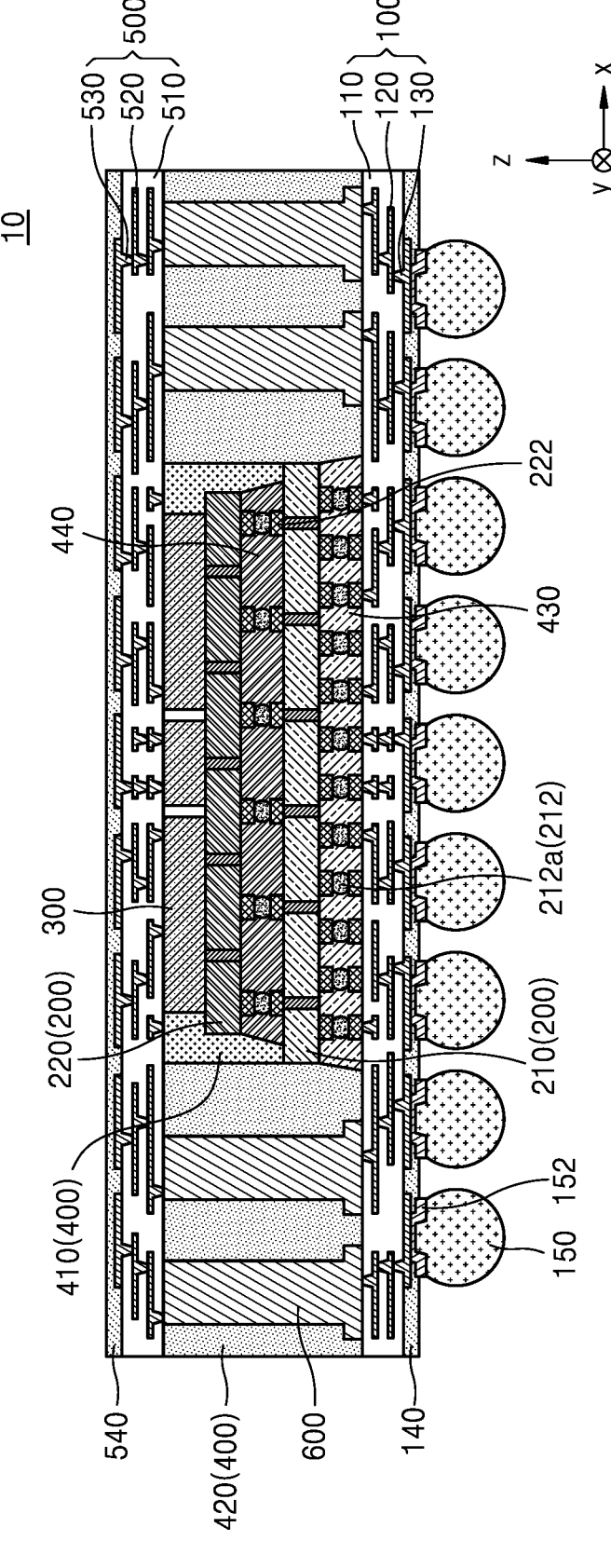

The first chip connection terminal 212 may be configured to connect the lower semiconductor chip 210 to the first molding layer 410 (FIG. 1C). Also, the second chip connection terminal 222 may be configured to connect the lower semiconductor chip 210 to the upper semiconductor chip 220. The chip connection terminal may be a conductive bump or conductive via. In another example embodiment, the chip connection terminal may be a solder ball of a metal material including at least one of Sn, Ag, Cu, and Al.

The chip connection terminal may be under bump metallization (UBM) deposited on the semiconductor chip 200 by vacuum or electroplating and then may be attached to the semiconductor chip 200. An UBM layer may be configured to facilitate adhesion of the semiconductor chip 200 and the conductive bump.

The heat dissipation structure 300 may be arranged on an upper surface of the upper semiconductor chip 220. The heat dissipation structure 300 may be configured to effectively dissipate heat generated from the semiconductor chips 200 upward. The second rewiring layer 500 may be coupled to an upper portion of the heat dissipation structure 300. For example, the heat dissipation structure 300 may be configured to transfer heat generated in the upper semiconductor chip 220 and the lower semiconductor chip 210 to the second rewiring layer 500. The heat dissipation structure 300 may be configured to effectively transfer heat generated in the semiconductor chips 200 by including a conductive via to the second rewiring layer 500.

The heat dissipation structure 300 may be formed of a material having higher thermal conductivity than the semiconductor chip 200 and/or the molding layer 400. For example, the heat dissipation structure 300 may include Cu. For example, the heat dissipation structure 300 may include electroplating Cu. In electroplating, coating of metal may be deposited on the heat dissipation structure 300 by electrolysis. The heat dissipation structure 300 may be formed in a plurality of layers. The plurality of layers may be formed of one same material or different materials. The material of the heat dissipation structure 300 is not limited to Cu. For example, the heat dissipation structure 300 may be formed of metal having good thermal conductivity. For example, the material of the heat dissipation structure 300 may include a metal such as Ni, gold (Au), Ag, Al, tungsten (W), titanium (Ti), tantalum (Ta), indium (In), Mo, Mn, Co, Sn, Mg, Re, Be, Ga, or Ru or an alloy thereof. For example, the thermal conductivity of the heat dissipation structure 300 may be about 350 W/mK to about 450 W/mK.

However, when the heat dissipation structure 300 is formed of metal, metal having a small thermal expansion coefficient with the upper semiconductor chip 220 may be selected as the material of the heat dissipation structure 300.

The heat dissipation structure 300 may be formed on the inactive surface of the upper semiconductor chip 220 by plating. After the TSV of the upper semiconductor chip 220 is exposed, an oxide layer may be formed, and the heat dissipation structure 300 may be patterned on the oxide layer. For example, the heat dissipation structure 300 may be a segmented structure in which a portion of the heat dissipation structure 300 is not connected.

In more detail, first, a portion of the inactive surface of the upper semiconductor chip 220 may be ground. A seed layer including Ti and/or Cu may be deposited on the inactive surface of the ground upper semiconductor chip 220. After a photosensitizer is applied onto the seed layer, the exposure process and the development process may be performed. After the exposure process and the development process are performed, the heat dissipation structure 300 may be disposed on an upper portion of the inactive surface of the upper semiconductor chip 220 in an electroplating manner. Last, the applied photosensitizer may be removed.

The heat dissipation structure 300 may have a smaller size than that of the upper semiconductor chip 220, as shown in FIG. 1B. However, according to an example embodiment, the heat dissipation structure 300 may also have a structure that is substantially the same size as the upper semiconductor chip 220. When the heat dissipation structure 300 has the same size as the upper semiconductor chip 220, a side surface of the heat dissipation structure 300 and a side surface of the upper semiconductor chip 220 may form the same plane (i.e., may be co-planar). When the heat dissipation structure 300 is formed to have a greater area than the area of the inactive surface of the upper semiconductor chip 220, a portion having a greater area than the area of the inactive surface of the upper semiconductor chip 220 of the heat dissipation structure 300 may be cut.

The entire thickness of the heat dissipation structure 300 may be less than the thickness of the upper semiconductor chip 220. For example, the thickness of the heat dissipation structure 300 may be about 20μm to about 40μm. The ratio of the thickness of the heat dissipation structure 300 to the thickness of the upper semiconductor chip 220 may be about 15% to about 25%. Thus, when the thickness of the upper semiconductor chip 220 varies, the thickness of the heat dissipation structure 300 may also vary. However, the thickness of the heat dissipation structure 300 is not limited to the above numerical range.

The heat dissipation structure 300 and the upper semiconductor chip 220 may be directly connected to each other, or another material may be inserted between the heat dissipation structure 300 and the upper semiconductor chip 220. For example, the upper semiconductor chip 220 may be directly connected to the heat dissipation structure 300 through the conductive via.

The molding layer 400 may be arranged on the first rewiring layer 100 to surround the side surface of the semiconductor chip 200. Also, the molding layer 400 may be configured to fix the semiconductor chip 200 to the first rewiring layer 100. Also, the molding layer 400 may be configured to prevent a short circuit between a plurality of connection structures 600.

In an example embodiment, a lower surface of the molding layer 400 may be on the same plane as (i.e., co-planar with) an upper surface of the first rewiring layer 100. Also, an upper surface of the molding layer 400 may be on the same plane as (i.e., co-planar with) the lower surface of the second rewiring layer 500, the upper surface of the connection structure 600, and the upper surface of the heat dissipation structure 300. Also, the side surface of the molding layer 400 may be on the same plane as (i.e., co-planar with) the side surface of the first rewiring layer 100 and the side surface of the second rewiring layer 500, as illustrated.

According to an example embodiment, the semiconductor package 10 may include two different molding layers 410 and 420. When the molding layers 410 and 420 (FIG. 1C) have different configurations, stress applied to the semiconductor package 10 may be dispersed. When stress is dispersed, a warpage phenomenon of the semiconductor package 10 may be prevented from occurring.

In an example embodiment, the molding layer 400 may include an epoxy molding compound (EMC). However, the example embodiment is not limited thereto, and the molding layer 400 may include various materials such as an epoxy-based material, a thermosetting material, a thermoplastic material, an ultraviolet (UV)-processed material, and the like. The first molding layer 410 and the second molding layer 420 may have the same or different components or configuration ratios thereof. For example, the thermal conductivity of the molding layer 400 may be higher than thermal conductivity of the under-fill member.

The first molding layer 410 may be a portion of the molding layer 400 arranged between the lower surface of the lower semiconductor chip 210 and the upper surface of the first rewiring layer 100. The second molding layer 420 may be a portion of the molding layer 400 arranged outside the semiconductor chip 200 from the side surface of the semiconductor chip 200. Also, the second molding layer 420 may be the molding layer 400 that surrounds the side surface of the first molding layer 410.

When the molding layer 400 includes two molding layers, the side surface of the first molding layer 410 may be on the same plane as (i.e., co-planar with) the side surface of the semiconductor chip 200, which is having a greater area between the upper semiconductor chip 220 and the lower semiconductor chip 210. When the area of the lower semiconductor chip 210 is greater than the area of the upper semiconductor chip 220, the upper surface of the first molding layer 410 may be on the same plane as the upper surface of the heat dissipation structure 300. Also, the side surface of the first molding layer 410 may be on the same plane as the side surface of the lower semiconductor chip 210.

When the area of the lower semiconductor chip 210 is smaller than the area of the upper semiconductor chip 220, the upper surface of the first molding layer 410 may be on the same plane as (i.e., co-planar with) the lower surface of the upper semiconductor chip 220. Also, the lower surface of the first molding layer 410 may be on a lower plane than the lower surface of the lower semiconductor chip 210. The side surface of the first molding layer 410 may be on the same plane as (i.e., co-planar with) the side surface of the upper semiconductor chip 220.

When the area of the lower semiconductor chip 210 is greater than the area of the upper semiconductor chip 220, the upper surface of the first molding layer 410 may be on the same plane as (i.e., co-planar with) the upper surface of the heat dissipation structure 300. Also, the lower surface of the first molding layer 410 may be on the same plane as (i.e., co-planar with) the upper surface of the lower semiconductor chip 210. The side surface of the first molding layer 410 may be on the same plane as (i.e., co-planar with) the side surface of the lower semiconductor chip 210.

The lower surface of the second molding layer 420 may be on the same plane as (i.e., co-planar with) the upper surface of the first rewiring layer 100. Also, the side surface of the second molding layer 420 may be on the same plane as (i.e., co-planar with) the side surface of the first rewiring layer 100. Last, the upper surface of the second molding layer 420 may be on the same plane as (i.e., co-planar with) the lower surface of the second rewiring layer 500, the upper surface of the heat dissipation structure 300, and the upper surface of the connection structure 600.

In an example embodiment, the upper surface of the molding layer 400 may be configured to expose the upper surface of the heat dissipation structure 300 and the upper surface of the connection structure 600. For example, the upper surface of the molding layer 400, the upper surface of the heat dissipation structure 300, and the upper surface of the connection structure 600 may be at substantially the same level (i.e., co-planar). Thus, a length (i.e., a thickness) of the semiconductor package 10 in a vertical direction (Z-direction) may be reduced. Also, the heat dissipation performance of the semiconductor package 10 may be enhanced.

According to the example embodiment, the semiconductor package 10 may have a double-sided rewiring structure to have a plurality of rewiring layers 100 and 500, e.g., a first rewiring layer 100 and a second rewiring layer 500. A redundant description of the functions and configurations of the first rewiring layer 100 and the second rewiring layer 500 is omitted.

The second rewiring layer 500 may include an upper insulating layer 510, a second rewiring line 520, a conductive via 530, and a passivation layer 540. A redundant content with the content described in the first rewiring layer 100 will be omitted.

The second rewiring layer 500 may be arranged on the heat dissipation structure 300 and the molding layer 400. As described above, the second rewiring layer 500 may be directly connected to the heat dissipation structure 300. For example, the second rewiring layer 500 may be connected to the heat dissipation structure 300 through the conductive via 530. The second rewiring layer 500 may be configured to receive heat from the heat dissipation structure 300 and to dissipate heat outside the semiconductor package 10. The second rewiring layer 500 may be connected to the upper portion of the heat dissipation structure 300 so that a region of the second rewiring layer 500 in which a heat dissipation function is performed, may be extended from the heat dissipation structure 300 to the second rewiring layer 500. Thus, the heat dissipation function of the semiconductor package 10 may be further enhanced.

As shown in FIG. 1B, the second rewiring layer 500 may have a rectangular flat plate shape, and the size of the second rewiring layer 500 may be greater than that of the heat dissipation structure 300. However, the shape and the size of the second rewiring layer 500 are not limited thereto. For example, the second rewiring layer 500 may have substantially the same size as that of the heat dissipation structure 300 or a smaller size than that of the heat dissipation structure 300.

Each of the first rewiring layer 100 and the second rewiring layer 500 may include a conductive material, for example, Cu, Al, Ag, Sn, Au, Ni, lead (Pb), Ti, or an alloy thereof.

The connection structure 600 may be configured to support the semiconductor package 10 and to transmit heat and/or an electrical signal between the first rewiring layer 100 and the second rewiring layer 500.

The connection structure 600 may be arranged on an upper surface of the first rewiring layer 100 so as to surround edges of the semiconductor chip 200. According to an example embodiment, the upper surface of the connection structure 600 may be in contact with the lower surface of the second rewiring layer 500. For example, the upper surface of the connection structure 600, the upper surface of the heat dissipation structure 300, and the lower surface of the second rewiring layer 500 may be at substantially the same level (i.e., co-planar). The connection structure 600 may be configured to vertically pass through the molding layer 400.

One semiconductor package 10 may include a plurality of connection structures 600. In FIGS. 1B through 1F, one semiconductor package 10 includes four connection structures 600 as an example. However, the inventive concept is not limited thereby. An example in which one semiconductor package 10 includes three or less or five or more connection structures 600, may be achieved. The connection structure 600 may include at least one of a Through Mold Via (TMV), a copper foil of an Embedded Trace Substrate (ETS), a conductive solder, a conductive pillar, and a conductive bump.

The ETS may be a substrate in which a circuit pattern is mounted in an insulating material. The ETS may have a coreless shape in which a core layer of the semiconductor substrate is removed. When the ETS has a coreless shape, the thickness of the semiconductor package 10 including the ETS may be reduced. The number of layers inside the ETS may be variously modified. The copper foil of the ETS may be configured to electrically connect different layers of the ETS or to support an ETS structure.

In the drawings, a structure having three layers is shown as an example. However, the inventive concept is not limited thereby. One ordinary skilled in the art may use an ETS having one to two or four or more layers based on the above description. In another example embodiment, the connection structure 600 may be a conductive pillar. Even when the connection structure 600 is a conductive pillar, the conductive pillar may be stacked manyfold and may be configured to electrically connect the first rewiring layer 100 to the second rewiring layer 500.

When the connection structure 600 is a conductive pillar, the conductive pillar may include at least one of Sn, Ag, Cu, and Al. In an example embodiment, the horizontal cross-section of the conductive pillar may have a circular shape. However, the shape of the horizontal cross-section of the conductive pillar is not limited to the above description. For example, the shape of the horizontal cross-section of the conductive pillar may be a polygonal shape. In an example embodiment, the vertical length of the conductive pillar may be substantially the same as the vertical length of the second molding layer 420.

FIGS. 1C through 1F are cross-sectional views of the semiconductor package 10 according to example embodiments. In FIGS. 1C through IF, the lower semiconductor chip 210 and the upper semiconductor chip 220 are coupled to the first rewiring layer 100 and the second rewiring layer 500. An already-described content in the description of FIGS. 1A and 1B is briefly described or omitted.

Referring to FIG. 1C, the area of the upper semiconductor chip 220 may be smaller than the area of the lower semiconductor chip 210. For example, the upper semiconductor chip 220 may be a logic semiconductor chip 200, and the lower semiconductor chip 210 may be a memory semiconductor chip 200. When the semiconductor package 10 is formed with a chip-last package structure, the upper surface of the heat dissipation structure 300 from the side surface of the lower semiconductor chip 210 may be surrounded by the same molding layer 400. For example, the semiconductor chips 200 may have a face-to-bottom (F2B) structure in which the inactive surface of the lower semiconductor chip 210 is in contact with the active surface of the upper semiconductor chip 220. In another example embodiment, the semiconductor chips 200 may have a face-to-face (F2F) structure.

Figure 1D:
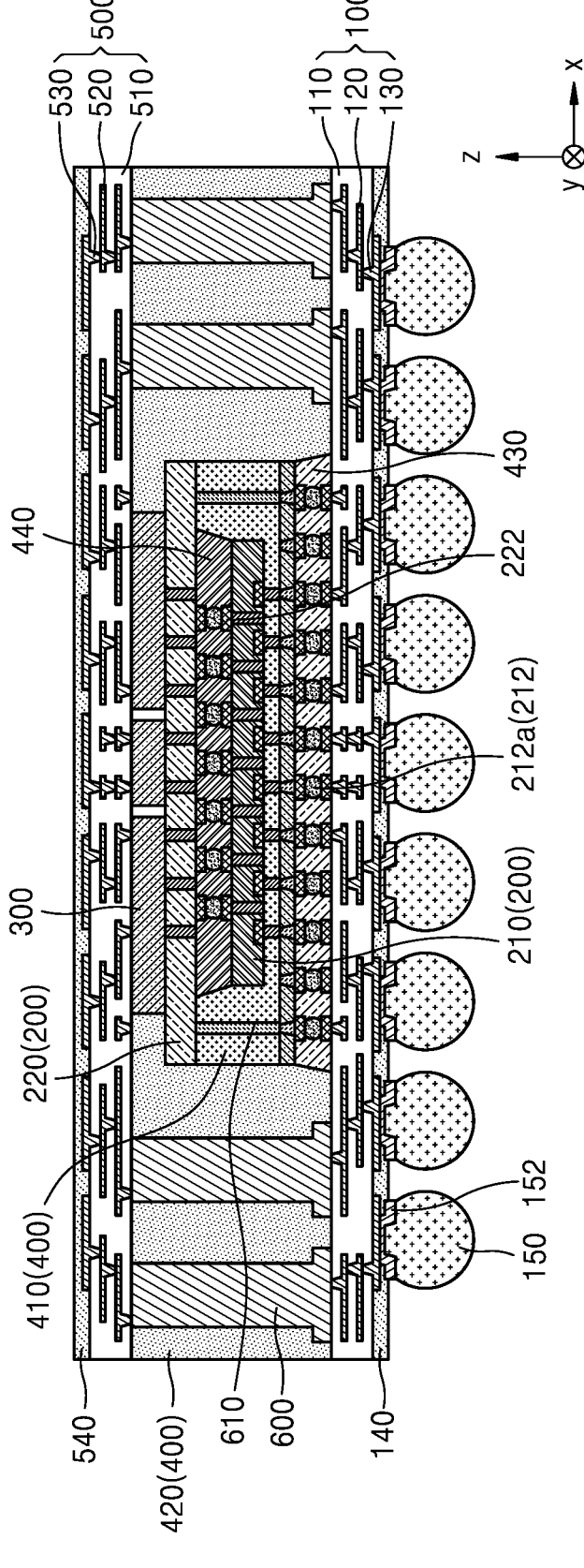

Referring to FIG. 1D, the area of the upper semiconductor chip 220 may be greater than the area of the lower semiconductor chip 210. For example, the upper semiconductor chip 220 may be a memory semiconductor chip 200, and the lower semiconductor chip 210 may be a logic semiconductor chip 200. When the area of the upper semiconductor chip 220 is greater, in order to increase stability of the structure of the semiconductor package 10, a semiconductor chip connection structure 610 may be further included. In the drawings, the active surface of the upper semiconductor chip 220 is connected to the semiconductor chip connection structure. When the semiconductor package 10 is formed with a chip-last package structure, the active surface of the upper semiconductor chip 220 from the side surface of the lower semiconductor chip 210 may be surrounded by the first molding layer 410. The semiconductor chip connection structure 610 may be configured to vertically pass through the first molding layer 410. The semiconductor chip connection structure 610 may also have the same material and the same shape as the connection structure 600.

Figure 1E:
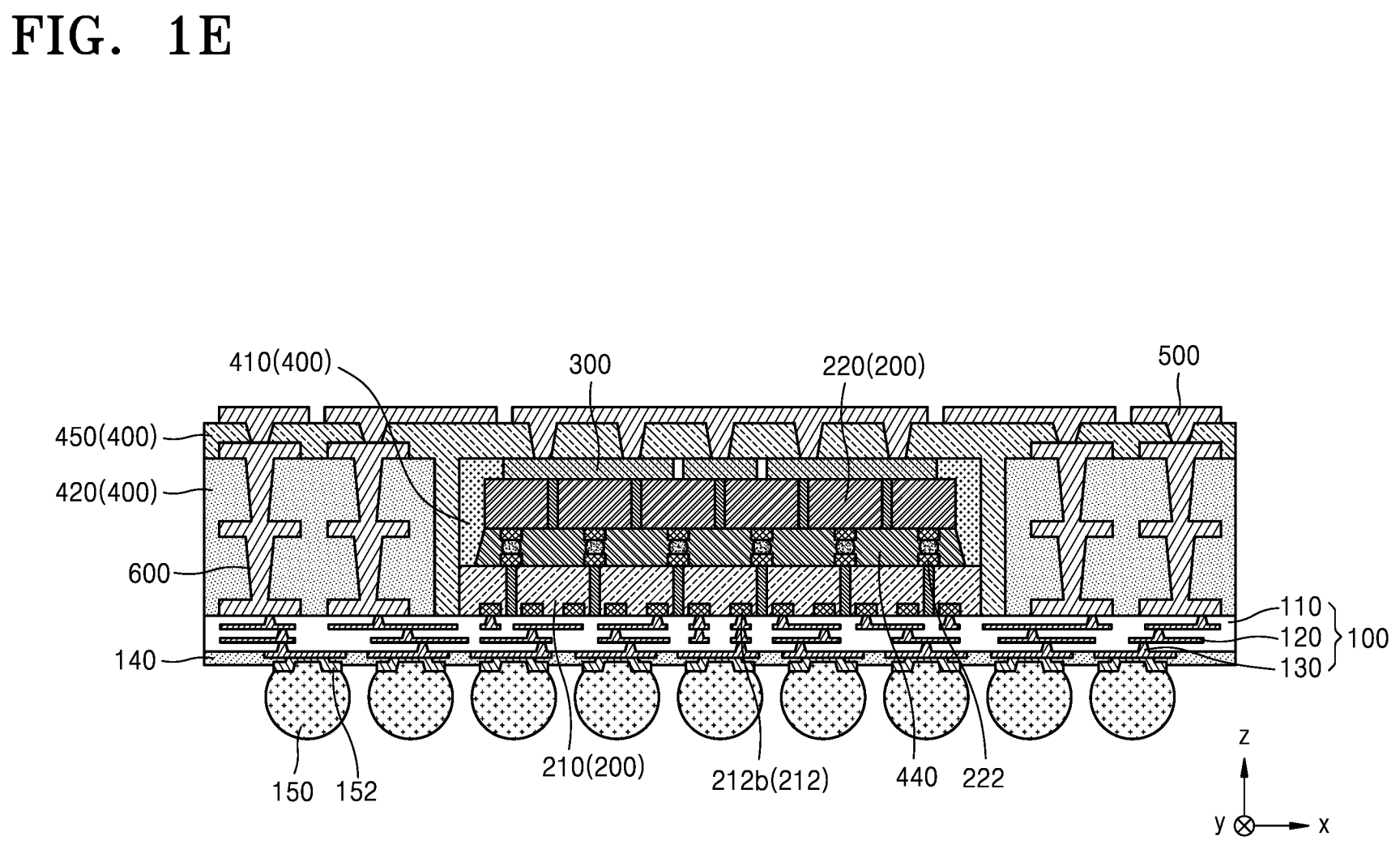

Referring to FIG. 1E, the area of the upper semiconductor chip 220 of the semiconductor package 10 may be smaller than the area of the lower semiconductor chip 210, and the semiconductor package 10 may be formed to have a chip-first package structure.

The upper surface of the heat dissipation structure 300 from the side surface of the lower semiconductor chip 210 may be surrounded by the first molding layer 400. The lower semiconductor chip 210 may be connected to the first rewiring layer 100 through a conductive via 212b.

In FIG. 1E, the connection structure 600 is a copper foil of the ETS as an example. In the drawings, a structure having three layers is shown as an example. However, the inventive concept is not limited thereby. One ordinary skilled in the art may use an ETS having one to two or four or more layers based on the above description.

When the copper foil of the ETS is selected as the connection structure 600, a third molding layer 450 may be additionally included. The third molding layer 450 may be formed to surround the upper surface of the heat dissipation structure 300, the upper surface of the first molding layer 410, the upper surface of the second molding layer 420 and/or the upper surface of the connection structure 600. A second rewiring layer 500 may be formed on the upper surface of the third molding layer 450. The second rewiring layer 500 may include a multi-layered copper wiring for electrically connecting the second rewiring layer 500 to the copper foil of the ETS.

Figure 1F:
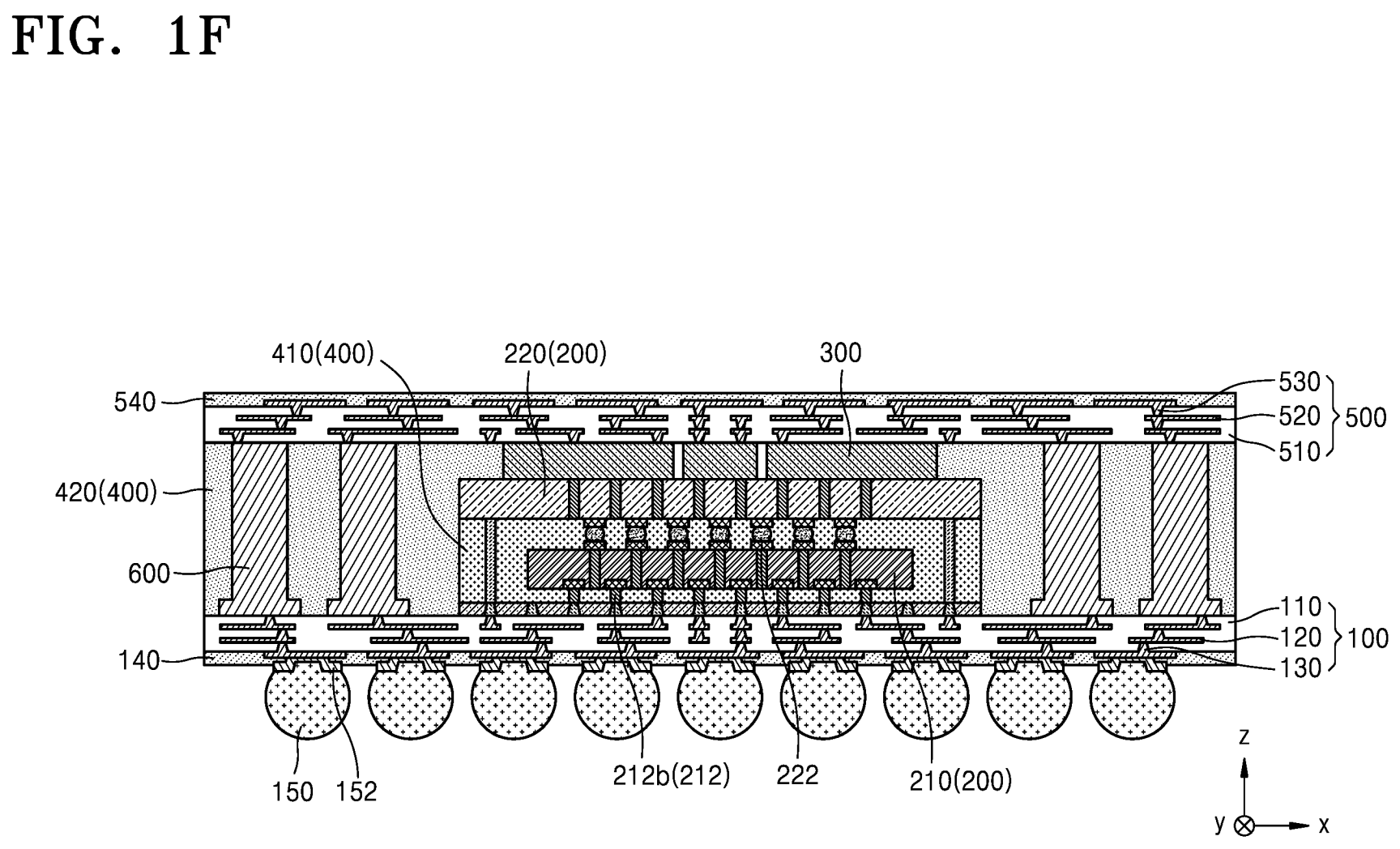

Referring to FIG. 1F, the area of the upper semiconductor chip 220 of the semiconductor package 10 may be greater than the area of the lower semiconductor chip 210, and the semiconductor package 10 may be formed to have a chip-first package structure.

When the semiconductor package 10 is formed with the chip-first package structure, the semiconductor package 10 may further include a semiconductor chip connection structure 610 so as to increase stability. The active surface of the upper semiconductor chip 220 from the side surface of the lower semiconductor chip 210 may be surrounded by the first molding layer 410.

Also, when the semiconductor package 10 is formed with the chip-first package structure, the active surface of the lower semiconductor chip 210 and the first rewiring layer 100 may be connected to each other through the conductive via 212b. In order to protect the conductive via 212b, the under-fill may be molded around the conductive via 212b.

Contrary to this, when the semiconductor package 10 is formed with the chip-last package structure, the active surface of the lower semiconductor chip 210 and the first rewiring layer 100 may be connected to each other through a conductive bump 212a. In order to protect the conductive bump 212a, the under-fill may be molded around the conductive bump 212a.

The first chip connection terminal 212 may be determined according to time when the plurality of semiconductor chips 200 are mounted.

Figure 2:
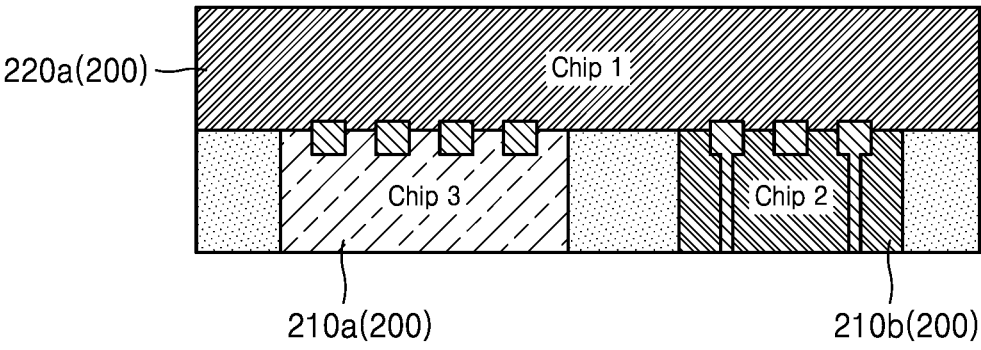
FIG. 2 is a view illustrating a case where a plurality of semiconductor chips according to an example embodiment are directly bonded to each other.

FIG. 2 is a view illustrating a case where the plurality of semiconductor chips 200 according to an example embodiment are directly bonded to each other.

Referring to FIG. 2, as described above, the semiconductor package 10 may be a system in package in which different types of a plurality of semiconductor chips 200 are electrically connected to each other and operate as one system. The types of the plurality of semiconductor chips 200 may be different form each other, or some of the plurality of semiconductor chips 200 may be the same.

For convenience of explanation, the upper semiconductor chip 220 may be referred to as chip 1 (220a), and the lower semiconductor chips 210 may be referred to as chip 2 (210a) and chip 3 (210b), respectively. The number of each of the lower semiconductor chips 210 and the upper semiconductor chips 220 may be variously modified. The upper semiconductor chip 220 and the lower semiconductor chip 210 may be electrically connected to each other.

When the plurality of semiconductor chips 200 in one semiconductor package 10 are connected to each other, a conductive bump may be used to connect the semiconductor chips 200, or the plurality of semiconductor chips 200 may be connected in a direct connection manner.

In the drawings, an example in which the lower semiconductor chip 210 and the upper semiconductor chip 220 are directly bonded to each other, is shown.

Each of chip 1 (220a), chip 2 (210a), and chip 3 (210b) may be Cu-to-Cu direct bonded to each other. Direct bonding of chip 1 (220a) and chip 3 (210b) may be connected to the TSV of chip 3 (210b). When a plurality of semiconductor chips 200 are connected using a direct bonding method, the plurality of semiconductor chips 200 may have a stack structure without a conductive bump.

Figure 3:
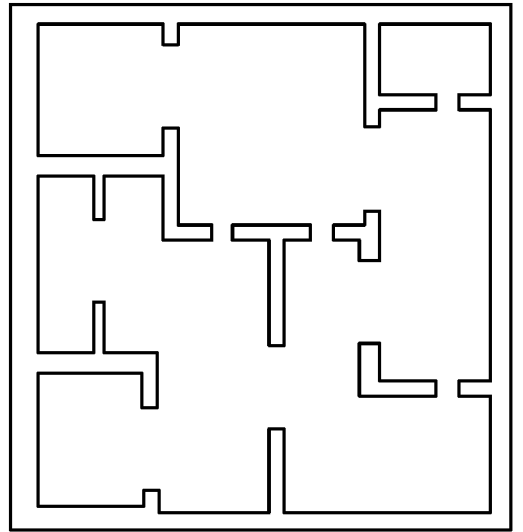
FIG. 3 is a perspective view illustrating a pattern of a heat dissipation structure according to an example embodiment.
Figure 3:
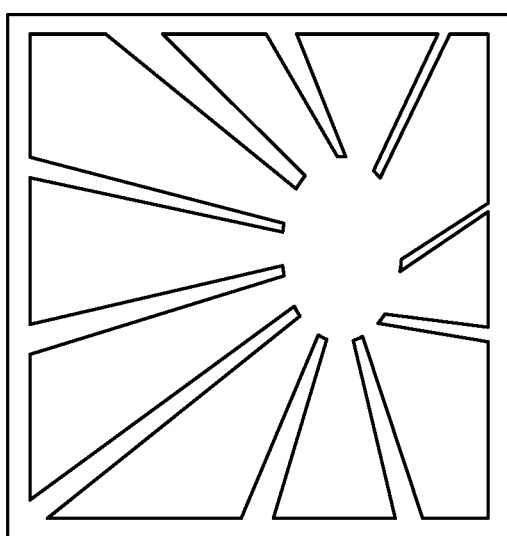
Figure 4A:
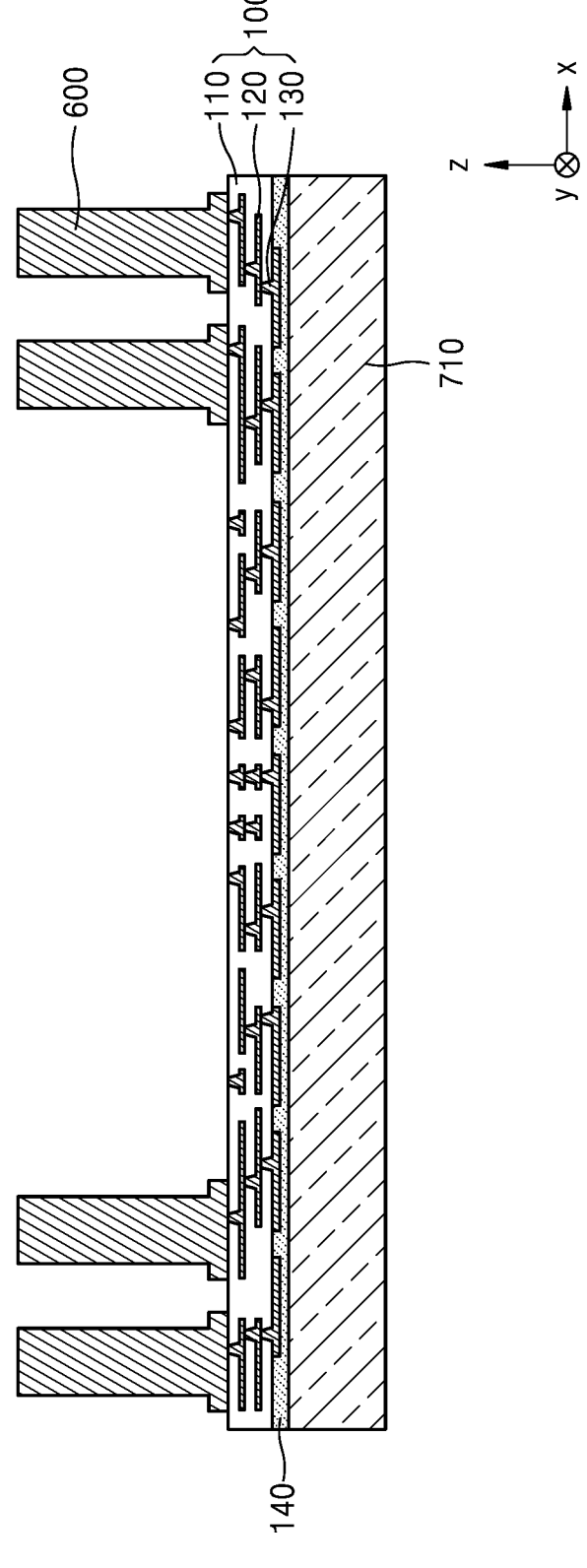
Figure 4D:
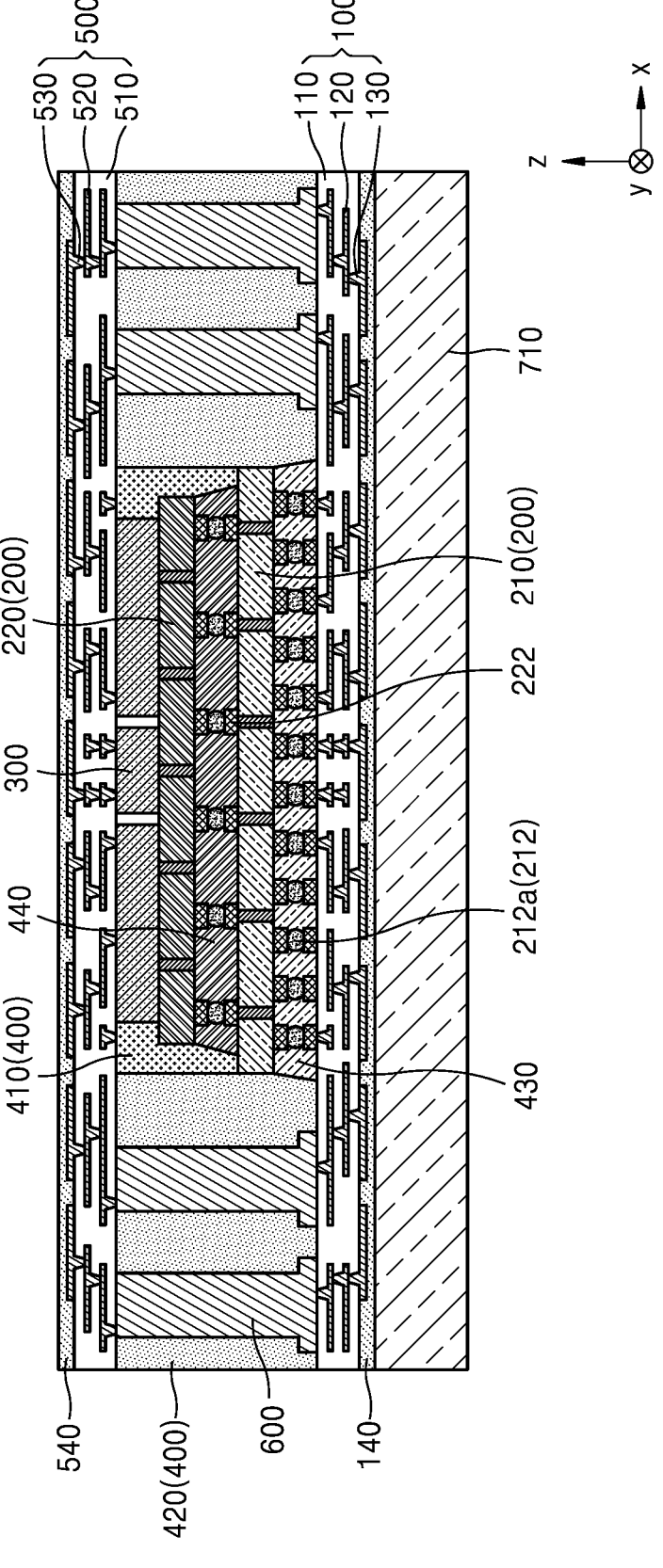
Figure 5A:
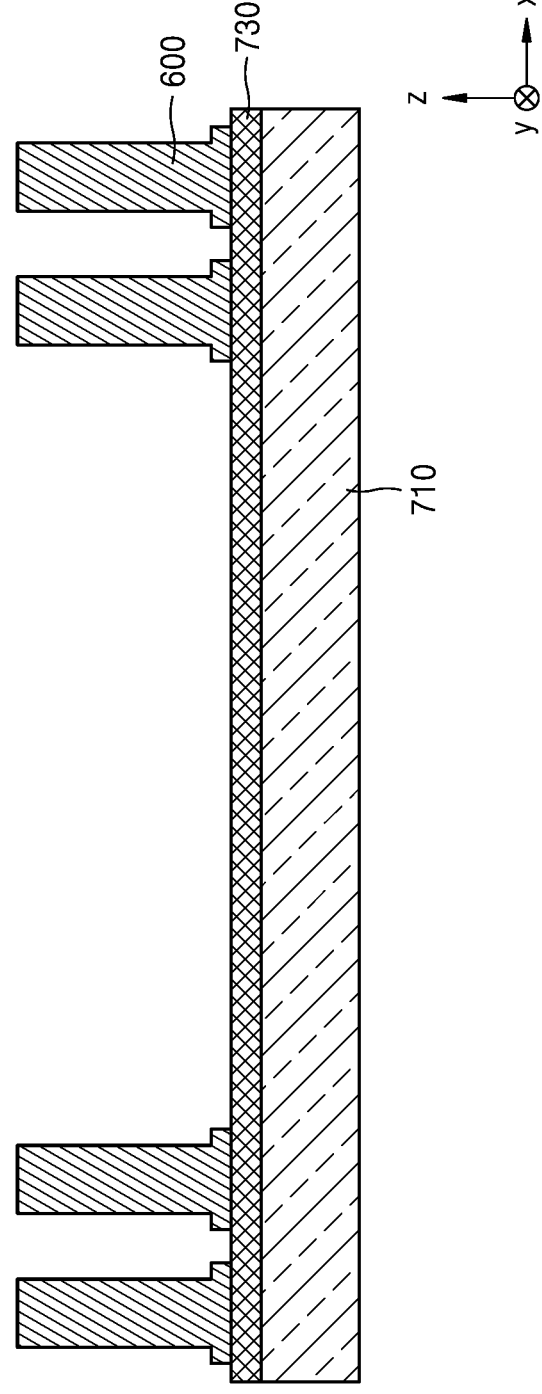
Figure 5B:
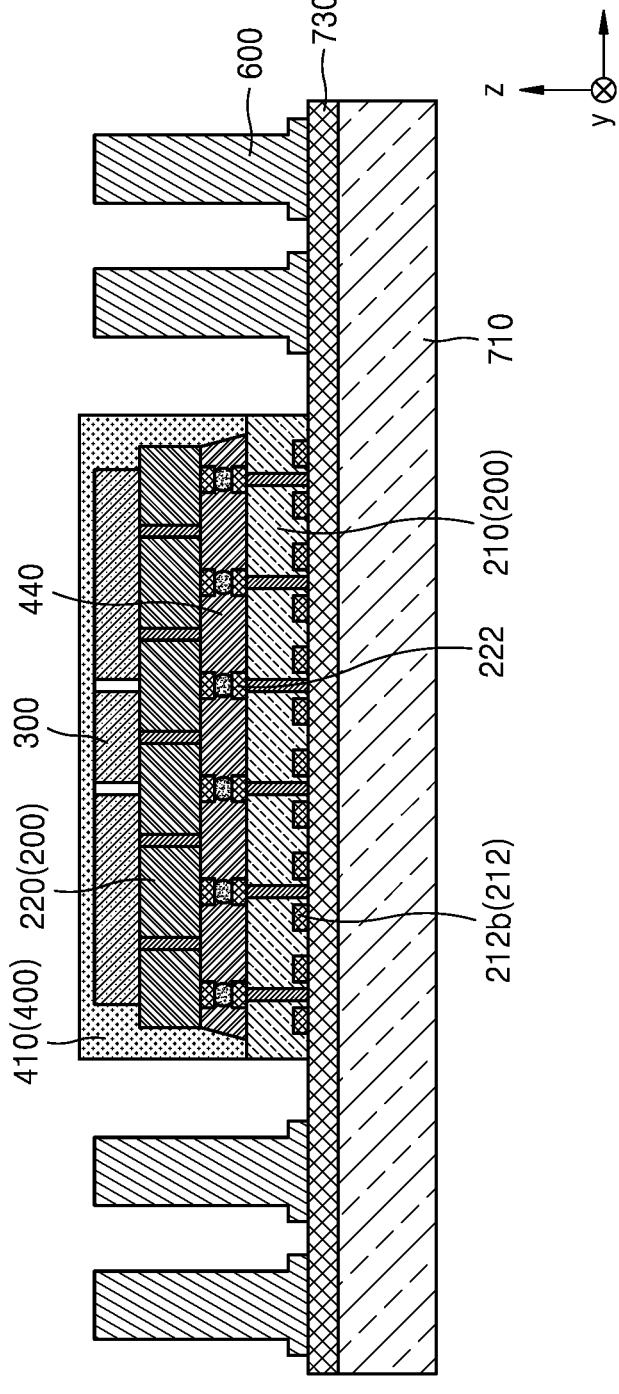
Figure 5C:
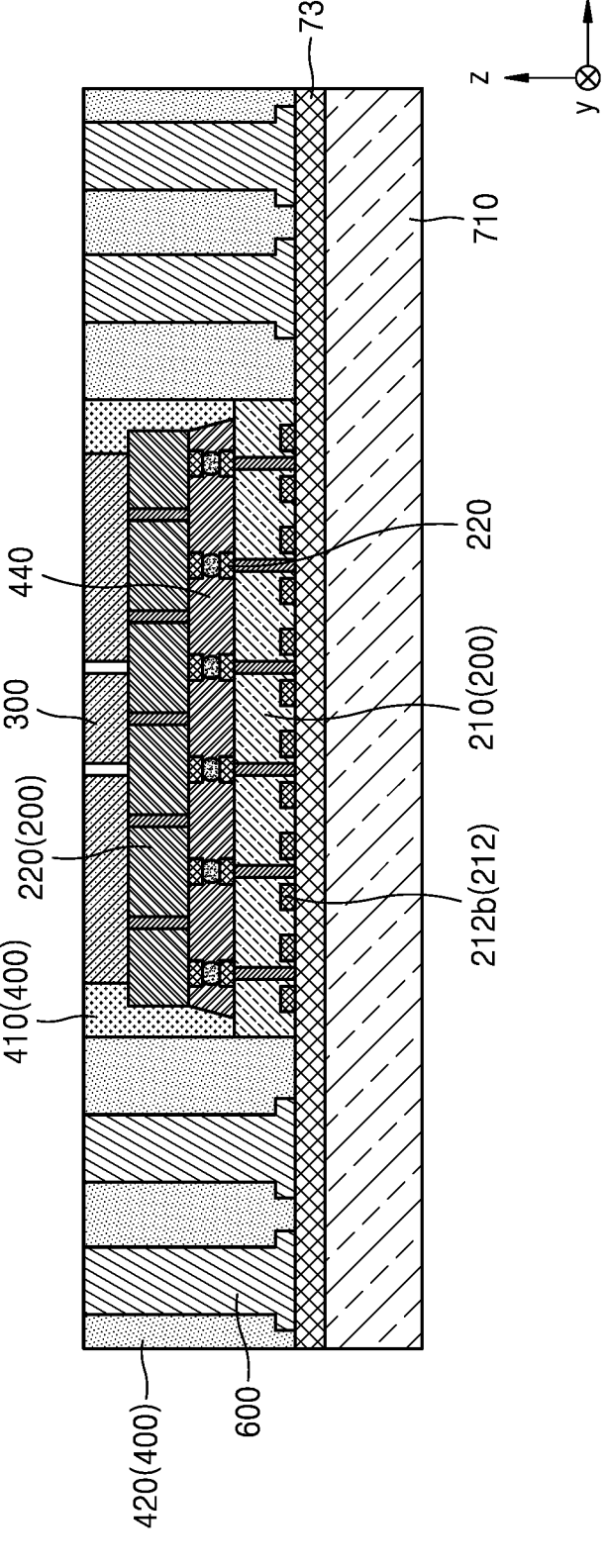
Figure 5D:
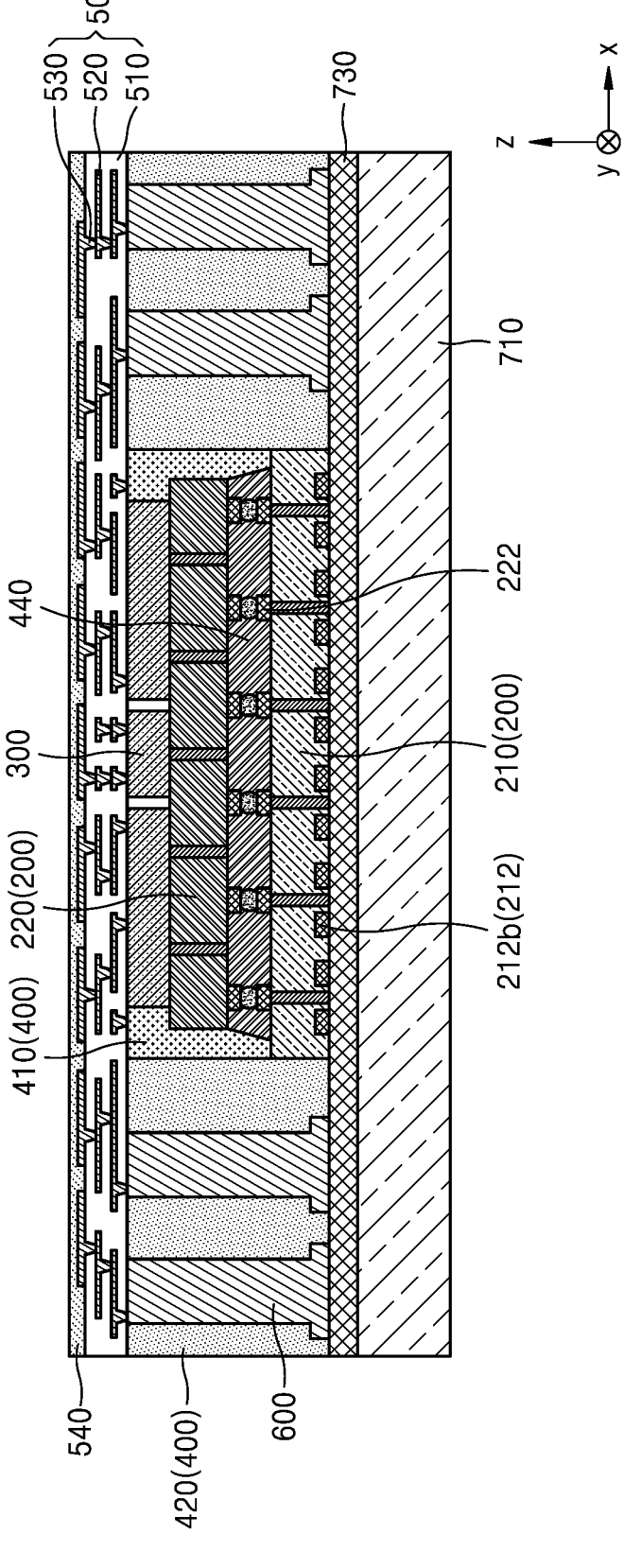
Figure 5E:

FIG. 3 is a perspective view of a pattern of a heat dissipation structure 300 according to an example embodiment.

Referring to FIG. 3, the heat dissipation structure 300 may have a rectangular pattern structure (left side of FIG. 3) or a radial pattern structure (right side of FIG. 3), as illustrated. Stress may be applied to the heat dissipation structure 300 due to a difference in thermal conductivity or density between the plurality of semiconductor chips (200 of FIG. 1), a molding layer (400 of FIG. 1) and/or a second rewiring layer (500 of FIG. 1), so that a warpage phenomenon may occur. Thus, in order to disperse stress, the heat dissipation structure 300 may include a pattern structure. The right heat dissipation structure may have a radial pattern. A radial center portion of the heat dissipation structure 300 may be connected to a hot spot HS of the upper semiconductor chip (220 of FIG. 1). The radial structure may contribute to effectively discharging heat generated in the upper semiconductor chip 220. The pattern structure of the heat dissipation structure 300 is not limited thereto, and another pattern structure may also be adopted.

As described above, the area of the heat dissipation structure 300 may be the same as or smaller than the area of the upper semiconductor chip 220. When the area of the heat dissipation structure 300 is smaller than the area of the upper semiconductor chip 220, the semiconductor package (10 of FIG. 1) may dissipate more heat generated in the upper semiconductor chip 220 toward the second rewiring layer 500 as the area of the heat dissipation structure 300 is increased.

FIGS. 4A-4F illustrate a method of manufacturing a semiconductor package 10 with a chip-last package structure according to an example embodiment.

Referring to FIGS. 4A through 4F, a case where the area of the lower semiconductor chip 210 is greater than the area of the upper semiconductor chip 220, is shown as an example. For example, the lower semiconductor chip 210 may be a memory semiconductor chip 200, and the upper semiconductor chip 220 may be a logic semiconductor chip 200.

First, a first rewiring layer 100 may be formed on a first support carrier 710. A connection structure 600 may be formed on the first rewiring layer 100. Thereafter, a lower semiconductor chip 210 and an upper semiconductor chip 220 may be mounted on the first rewiring layer 100. As described above, the heat dissipation structure 300 may be mounted on the upper semiconductor chip 220. After the plurality of semiconductor chips 200 are mounted, the first molding layer 410 may be configured to surround the outside of the semiconductor chips 200. Thereafter, a portion of an upper portion of the first molding layer 410 may be ground.

Alternatively, in a state in which the upper surface of the first molding layer 410 is ground to be located on substantially the same plane as the upper surface of the connection structure 600, the lower semiconductor chip 210 and the upper semiconductor chip 220 may be mounted on the first rewiring layer 100.

When the first molding layer 410 is ground, the upper surface of the heat dissipation structure 300 may be in contact with the lower surface of the second rewiring layer 500. Thus, the height from the first rewiring layer 100 to the heat dissipation structure 300, the height of the connection structure 600, and the height of a second molding layer 420 to be described below may be substantially the same.

Thereafter, the second molding layer 420 may be formed on the upper surface of the first rewiring layer 100 and the side surface of the first molding layer 410. When the second molding layer 420 is formed, the upper surface of the second molding layer 420 may be ground according to the height from the first rewiring layer 100 to the heat dissipation structure 300 or the height of the connection structure 600. Thereafter, a second support carrier 720 may be attached to the upper surface of the second molding layer 420, and the first support carrier 710 may be removed. After an external connection terminal 150 is formed below the first rewiring layer 100, the second support carrier 720 may be removed.

Figure 5F:
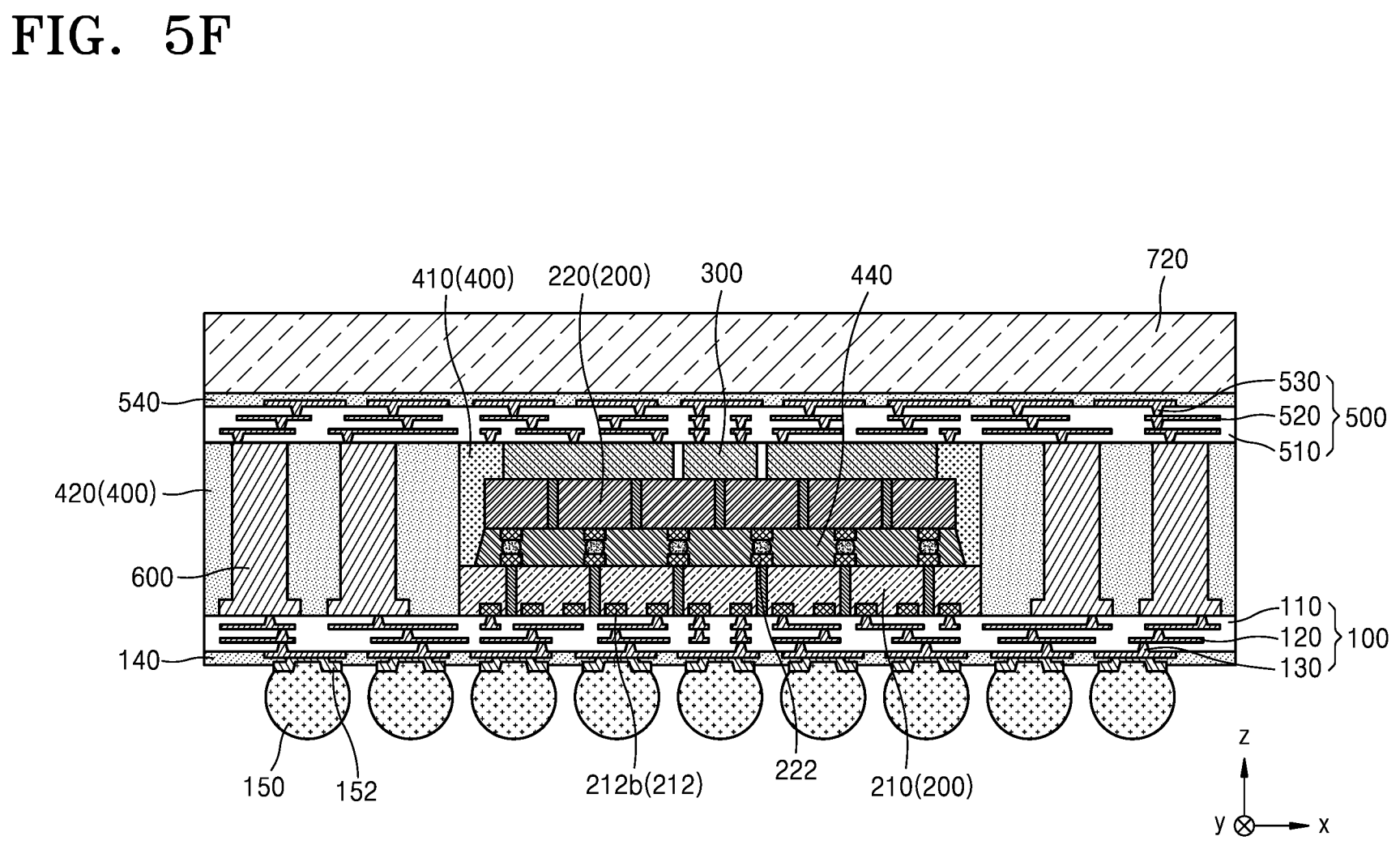

FIGS. 5A-5F illustrate a method of manufacturing a semiconductor package 10 with a chip-first package structure according to an example embodiment.

Referring to FIGS. 5A through 5F, a case where the area of the lower semiconductor chip 210 is greater than the area of the upper semiconductor chip 220, is shown as an example. For example, the lower semiconductor chip 210 may be a memory semiconductor chip 200, and the upper semiconductor chip 220 may be a logic semiconductor chip 200.

First, a tape 730 to which the semiconductor chips 220 may be attached, may be formed on the first support carrier 710. The tape 730 may be a Kapton tape 730 formed of a polyimide material. The Kapton tape 730 may be used in a semiconductor process, because the Kapton tape 730 has high heat resistance and thus is easily used at a high temperature. The material of the tape 730 is not limited thereto. The connection structure 600, and a plurality of semiconductor chips 200 molded by the first molding layer 410 may be mounted on the tape 730. In the case of the chip-first package structure, the plurality of semiconductor chips 200 may be molded in advance before being mounted on the tape 730. As described above, the plurality of semiconductor chips 200 may include the heat dissipation structure 300. Thereafter, a portion of an upper portion of the first molding layer 410 may be ground.

Alternatively, in a state in which the upper surface of the first molding layer 410 is ground to be located on substantially the same plane as the upper surface of the connection structure 600, the lower semiconductor chip 210 and the upper semiconductor chip 220 may be mounted on the first rewiring layer 100.

Thus, the heat dissipation structure 300 and the second rewiring layer 500 may be in contact with each other. The height from the first rewiring layer 100 to the heat dissipation structure 300, the height of the connection structure 600, and the height of the second molding layer 420 may be substantially the same.

Thereafter, the second molding layer 420 may be formed on the upper surface of the tape 730 and the side surface of the first molding layer 410. When the second molding layer 420 is formed, the upper surface of the second molding layer 420 may be ground according to the height from the first rewiring layer 100 to the heat dissipation structure 300 or the height of the connection structure 600. Thereafter, the second support carrier 720 may be attached to the upper surface of the second molding layer 420, and the first support carrier 710 and the tape 730 may be removed. Thereafter, the first rewiring layer 100 may be formed below the first molding layer 410. After the external connection terminal 150 is formed below the first rewiring layer 100, the second support carrier 720 may be removed.

While the inventive concept has been particularly shown and described with reference to embodiments thereof, it will be understood that various changes in form and details may be made therein without departing from the scope of the following claims.

What is claimed is:

1. A semiconductor package comprising:
a first rewiring layer;
a lower semiconductor chip on the first rewiring layer;
a first chip connection terminal between the lower semiconductor chip and the first rewiring layer, the first chip connection terminal configured to connect the lower semiconductor chip to the first rewiring layer;
an upper semiconductor chip on the lower semiconductor chip;
a second chip connection terminal between the lower semiconductor chip and the upper semiconductor chip, the second chip connection terminal configured to connect the lower semiconductor chip to the upper semiconductor chip;
a heat dissipation structure on the upper semiconductor chip, wherein the heat dissipation structure has a smaller width than that of the upper semiconductor chip such that side surfaces of the heat dissipation structure do not overlap respective side surfaces of the upper semiconductor chip;

a second rewiring layer on the heat dissipation structure, the second rewiring layer comprising an insulating layer, a plurality of rewiring lines within the insulating layer, and a plurality of conductive vias connecting the plurality of rewiring lines, wherein the second rewiring layer is directly connected to an upper surface of the heat dissipation structure through one or more of the plurality of conductive vias;

a first molding layer on the first rewiring layer, wherein the first molding layer contacts respective side surfaces of the upper semiconductor chip and the heat dissipation structure;

a second molding layer on the first rewiring layer, wherein the second molding layer contacts a side surface of the first molding layer;

one or more connection structures adjacent to the side surfaces of the upper semiconductor chip and the lower semiconductor chip, wherein the one or more connection structures extend through the second molding layer and connect the first rewiring layer to the second rewiring layer, wherein a horizontal width of the upper semiconductor chip and a horizontal width of the lower semiconductor chip are different from each other, the upper semiconductor chip and the heat dissipation structure contact each other, an upper surface of the heat dissipation structure, upper surfaces of the one or more connection structures, a lower surface of the second rewiring layer, an upper surface of the first molding layer, and an upper surface of the second molding layer are co-planar, and the heat dissipation structure has a segmented structure in which at least a portion of the heat dissipation structure is not connected.

2. The semiconductor package of claim 1, wherein a ratio of a thickness of the heat dissipation structure to a thickness of the upper semiconductor chip is about 15% to about 25%.

3. The semiconductor package of claim 1, wherein the heat dissipation structure comprises copper, and a thickness of the heat dissipation structure is about 20 μm to about 40 μm.

4. The semiconductor package of claim 1, wherein each of the first chip connection terminal and the second chip connection terminal comprises a conductive bump or a conductive via.

5. The semiconductor package of claim 1, wherein the heat dissipation structure is on at least a portion of an upper surface of the upper semiconductor chip.

6. The semiconductor package of claim 1, wherein each of the one or more connection structures comprises a copper foil of an Embedded Trace Substrate (ETS), a conductive solder, a conductive pillar, or a conductive bump.

7. The semiconductor package of claim 6, wherein the conductive pillar comprises copper.

8. The semiconductor package of claim 1, wherein each of the lower semiconductor chip and the upper semiconductor chip comprises a logic semiconductor chip or a memory semiconductor chip.

9. The semiconductor package of claim 1, wherein the first chip connection terminal comprises a conductive via.

10. The semiconductor package of claim 1, wherein the first chip connection terminal comprises a conductive bump.

* * * * *